United States Patent
Tian et al.

(10) Patent No.: US 12,293,800 B2
(45) Date of Patent: May 6, 2025

(54) NON-VOLATILE MEMORY WITH LAYOUT ADAPTIVE PROBLEMATIC WORD LINE DETECTION

(71) Applicant: Western Digital Technologies, Inc., San Jose, CA (US)

(72) Inventors: Xuan Tian, Shanghai (CN); Liang Li, Shanghai (CN); Dandan Yi, Shanghai (CN); Jojo Xing, Shanghai (CN); Vincent Yin, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 104 days.

(21) Appl. No.: 18/346,367

(22) Filed: Jul. 3, 2023

(65) Prior Publication Data
US 2025/0006287 A1    Jan. 2, 2025

Related U.S. Application Data

(60) Provisional application No. 63/510,716, filed on Jun. 28, 2023.

(51) Int. Cl.
*G11C 29/12*     (2006.01)
*G11C 29/24*     (2006.01)

(52) U.S. Cl.
CPC ........ *G11C 29/12005* (2013.01); *G11C 29/24* (2013.01); *G11C 2029/1202* (2013.01)

(58) Field of Classification Search
CPC .............. G11C 29/12005; G11C 29/24; G11C 2029/1202
See application file for complete search history.

(56) References Cited

U.S. PATENT DOCUMENTS

| | | | |
|---|---|---|---|
| 2012/0275228 A1* | 11/2012 | Lu .................. | G11C 29/025 365/185.18 |
| 2013/0088932 A1 | 4/2013 | Yamagami | |
| 2020/0051659 A1* | 2/2020 | Matsubara ........... | G11C 29/832 |
| 2024/0013842 A1* | 1/2024 | Jing ................... | G11C 16/3445 |

* cited by examiner

*Primary Examiner* — Mohammed A Bashar
(74) *Attorney, Agent, or Firm* — Pearl Cohen Zedek Latzer Baratz LLP

(57) ABSTRACT

In addition to word line related short circuits within the blocks of the array structure of a non-volatile memory device, such as NAND memory, word line related shorts can also occur in the routing for supplying the word lines of the memory blocks. Depending on the layout of the routing, some shorts for the word lines associated with one block can affect other blocks of the memory array. In particular, if the routing of a pair of adjacent local supply lines are adjacent to a global supply line, a short between the pair of adjacent local supply lines for one block can lead, through the global supply line, to defects in another of the block. Techniques are presented for detecting these layout related problematic word lines.

20 Claims, 32 Drawing Sheets

NON-VOLATILE MEMORY WITH LAYOUT ADAPTIVE PROBLEMATIC WORD LINE DETECTION

CLAIM OF PRIORITY

The present application claims priority from U.S. Provisional Patent Application No. 63/510,716, entitled "NON-VOLATILE MEMORY WITH LAYOUT ADAPTIVE PROBLEMATIC WORD LINE DETECTION," by Tian et al., filed Jun. 28, 2023, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

During a program operation a series of program voltage pulses are applied to the control gates of the memory cells. Each voltage pulse may be stepped up in magnitude from a previous program pulse by a step size in a process referred to as incremental step pulse programming. Each program voltage may be followed by a verify operation to determine if the respective memory cells have been programmed to the desired memory state. Thus, the program operation may include a number of program/verify loops. The word line that is connected to the memory cells being verified is referred to herein as the "selected word line." The remaining word lines connected to other memory cells on the NAND strings are referred to herein as "unselected word lines."

Following manufacturing defects may exist in the memory structure. For example, there could be a short circuit between a word line and a NAND string. There could be a short circuit between a word line and conductive line such as a source line. Such defects can result in dysfunction of memory operations such as erase, program, and/or read. Such defects can potentially result in data loss. Therefore, the memory structure is typically tested after manufacture to detect such defects. Regions of the memory structure having a defect may be retired. For example, a block of memory cells that contains a defect may be marked as a bad block such that it is not used in the field.

Normal memory operations in the field create a small amount of stress on the memory structure. Over time it is possible that the cumulative stress from many memory operations can create a defect. Herein the term "grown bad block" refers to a block of memory cells that develop a defect in the field. Some memory systems will test for and retire grown bad blocks. For example, some systems may test for defects during a program operation. However, testing for defects during a program operation may impact performance.

BRIEF DESCRIPTION OF THE DRAWINGS

Like-numbered elements refer to common components in the different figures.

DETAILED DESCRIPTION

Technology is disclosed herein for detecting short circuits involving word lines in a non-volatile storage system. A word line that is involved in a short circuit (or more briefly "short") is referred to herein as a "leaky word line," which refers to current leakage that occurs as a result of the short circuit. In addition to short circuits within the block structure of a memory array, such as word line to NAND channel short or word line to word line short, that cause an individual block of an array to be defective, there can also be shorts in the routing of the metal supply lines for word lines and select gates. This sort of short can result in a global defect in a memory plane, in which a short associated with the routing in one block will also affect other blocks of a memory plane. The following presents techniques for determining these sorts of defects that can lead to plane level failure of a memory device.

More specifically, the following discussion considers the detection of layout adaptive problematic word lines. When a pair of local supply lines for the control lines, such as word lines or select gates lines, run adjacent to each other in their routing from the transfer switches in the row select circuitry, and when this pair is also adjacent to a global supply line routed to the transfer switches to supply multiple blocks, if there is a short between the pair of local supply lines associated with block, this can lead to the short affecting other blocks. The pairs of adjacent local supply lines that can lead to the problems is layout dependent, based on the routing of the local supply lines, that are typically in one metal layer, and the global supply lines, that are typically routed in another metal layer of a die. These layout specific problematic word line pairs or word line-select line pairs are biased to have a high voltage difference between them, such as setting one of the lines to a program voltage and the other to ground while the other word lines are left to float, and then checked for current leakage. If such leakage is found, the die can be marked as defective at the plane level. To implement this test mode, a set of high voltage switches can be introduced to allow the used biasing of the layout specific control lines.

Figure 1:
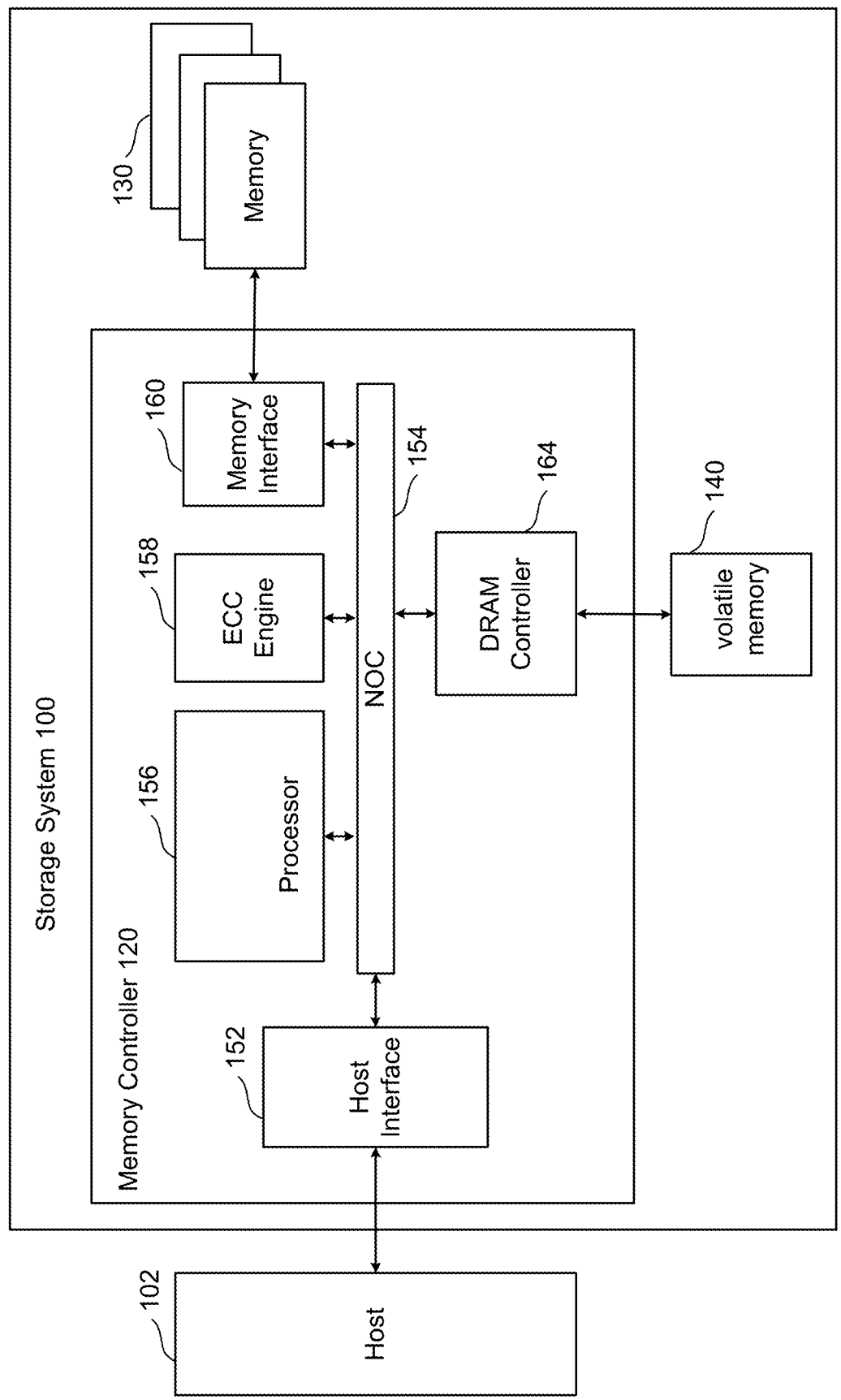
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
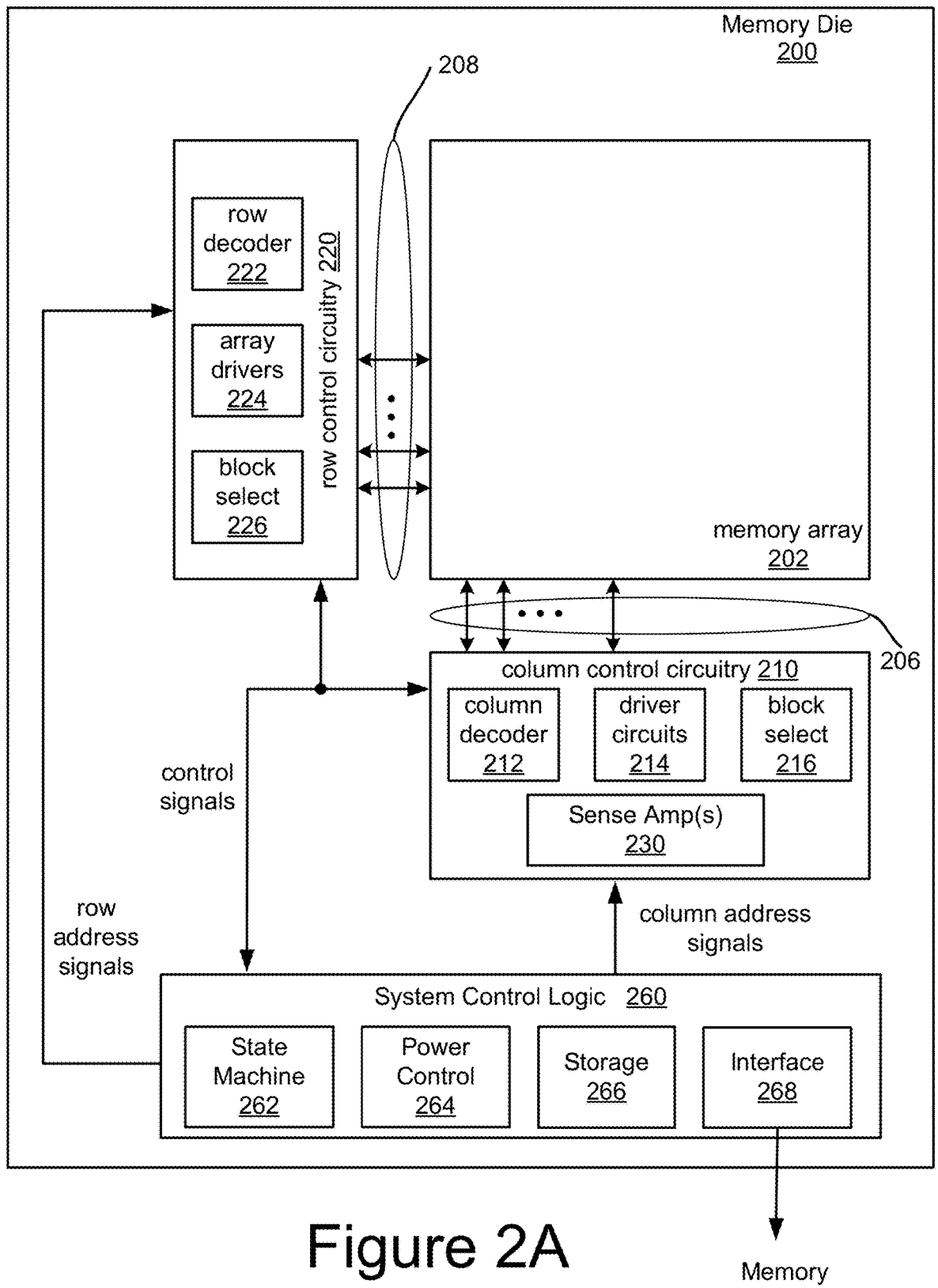
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
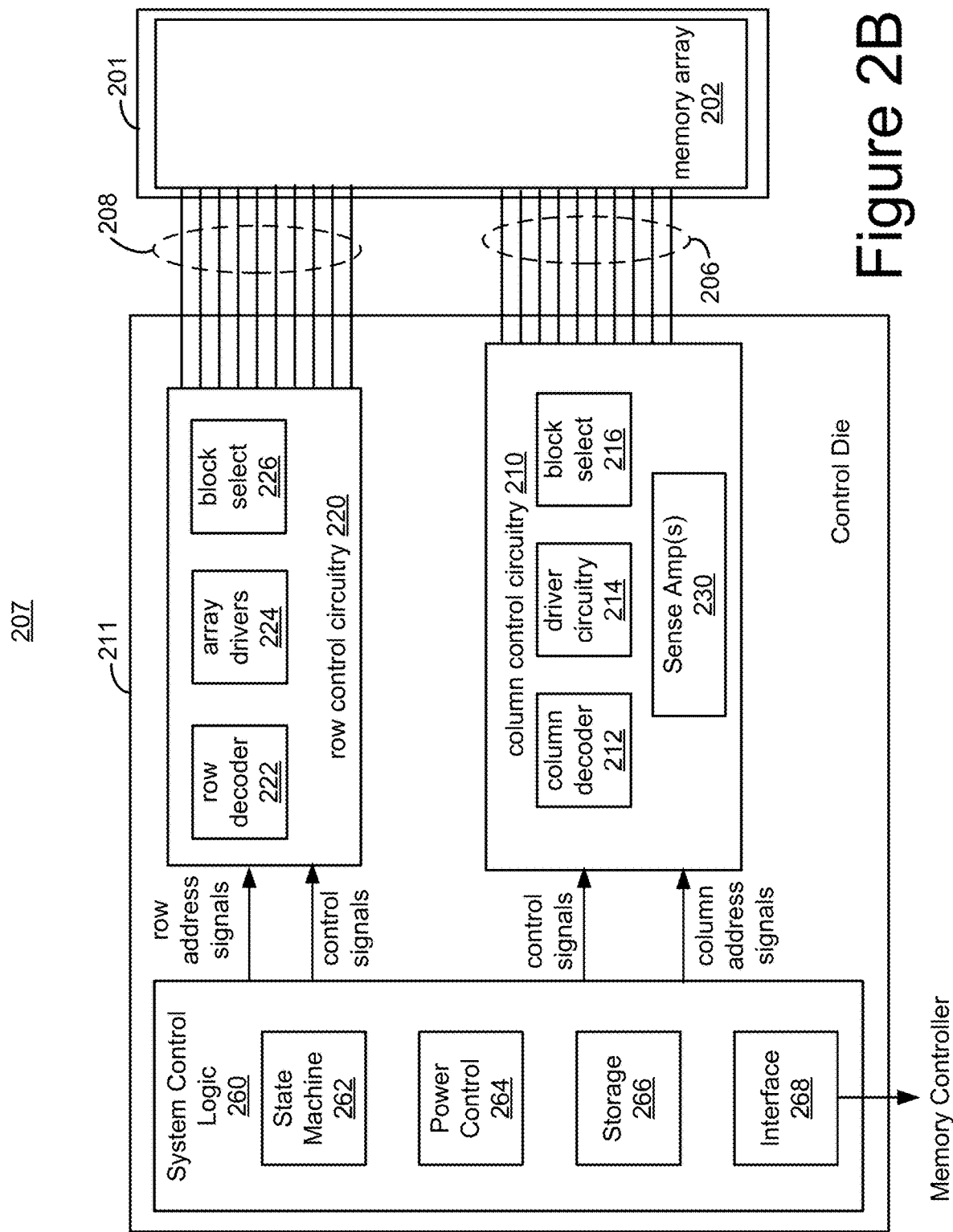
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201. which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The one or more control circuits can include hardware only or a combination of hardware and software (including firmware). For example, a controller programmed by firmware to perform the functions described herein is one example of a control circuit. A control circuit can include a processor, FGA, ASIC. integrated circuit, or other type of circuit.

Figure 3A:
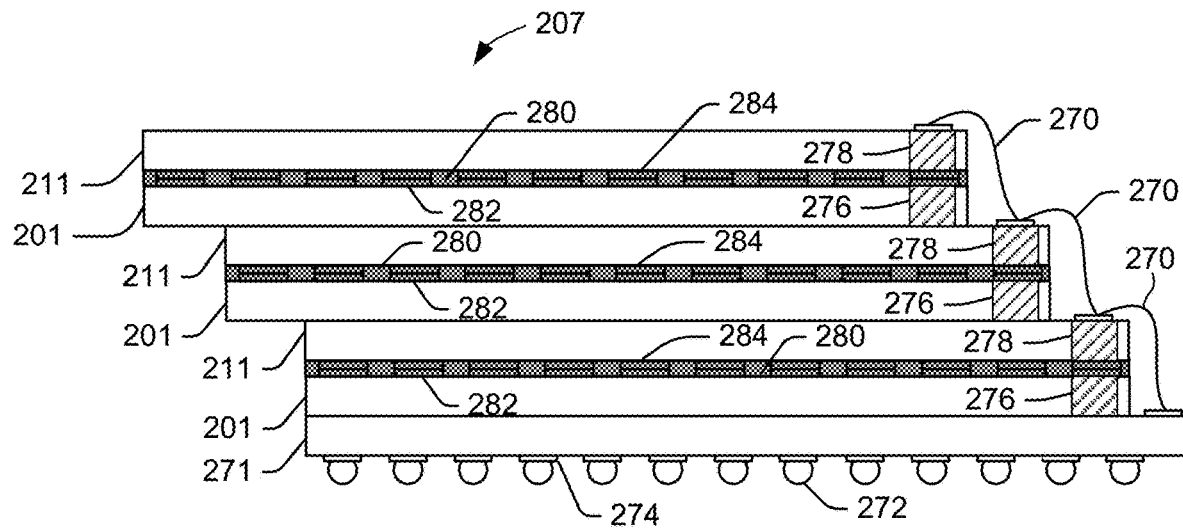
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211 via the bond pads, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
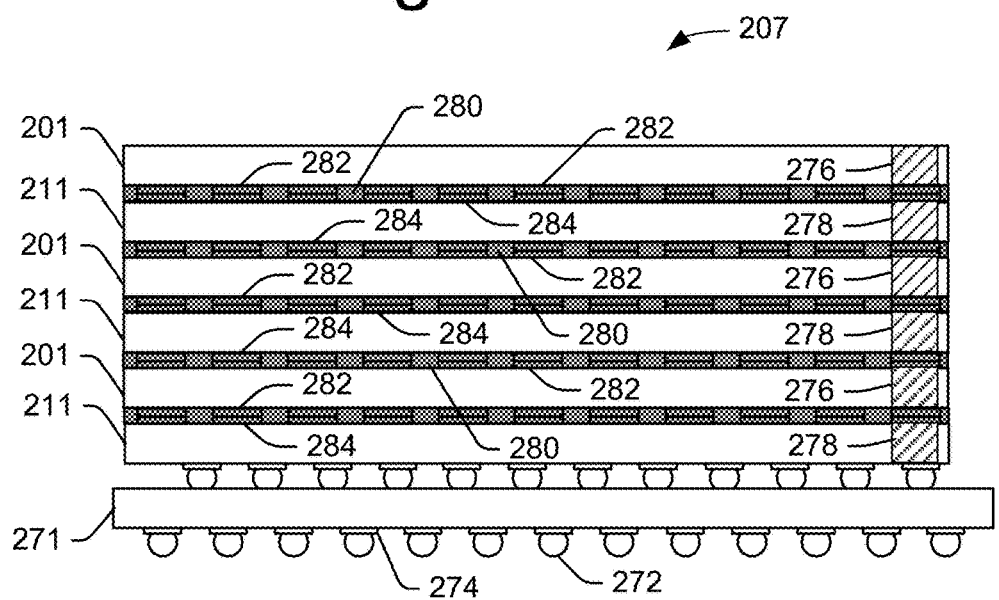

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1um to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
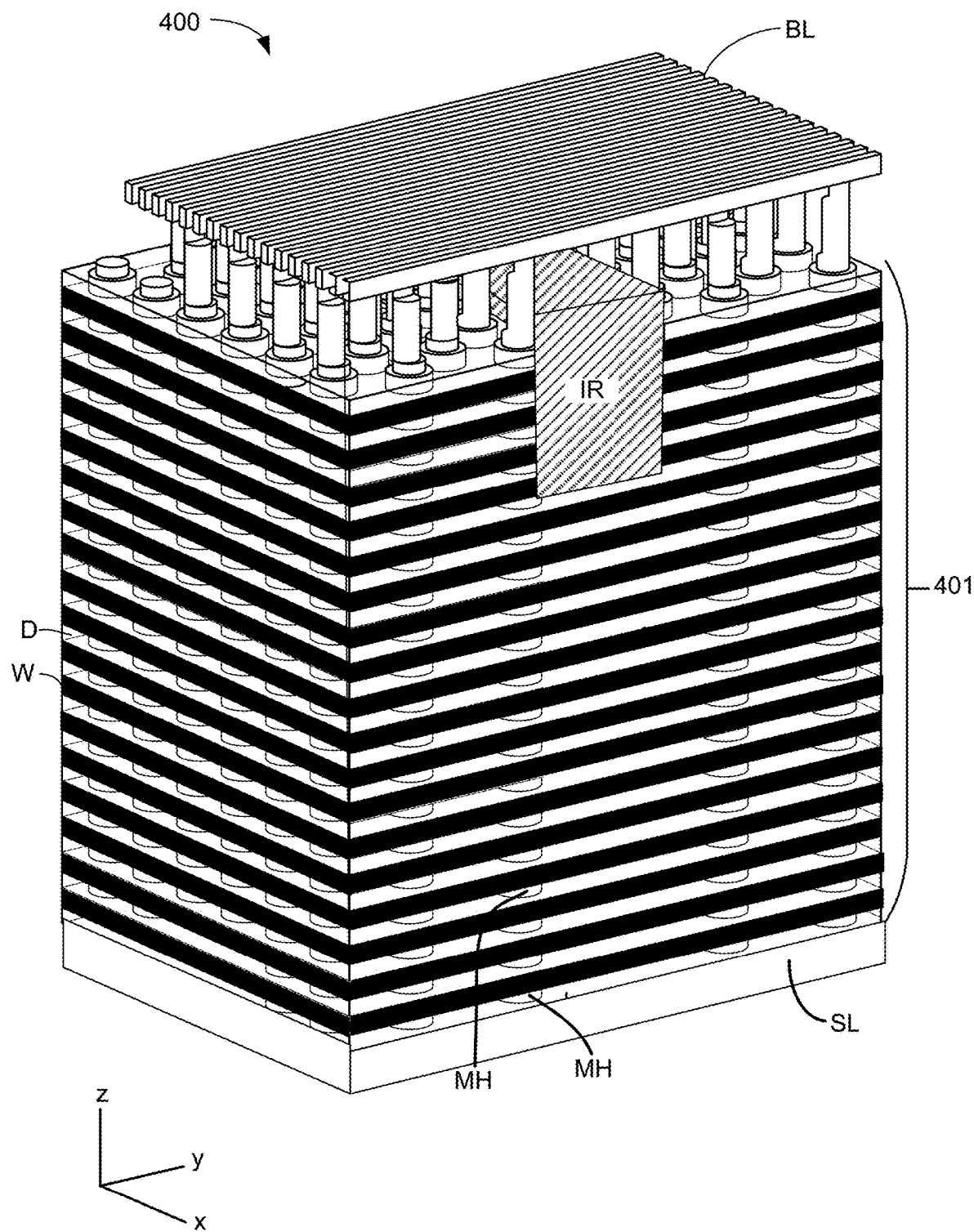
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
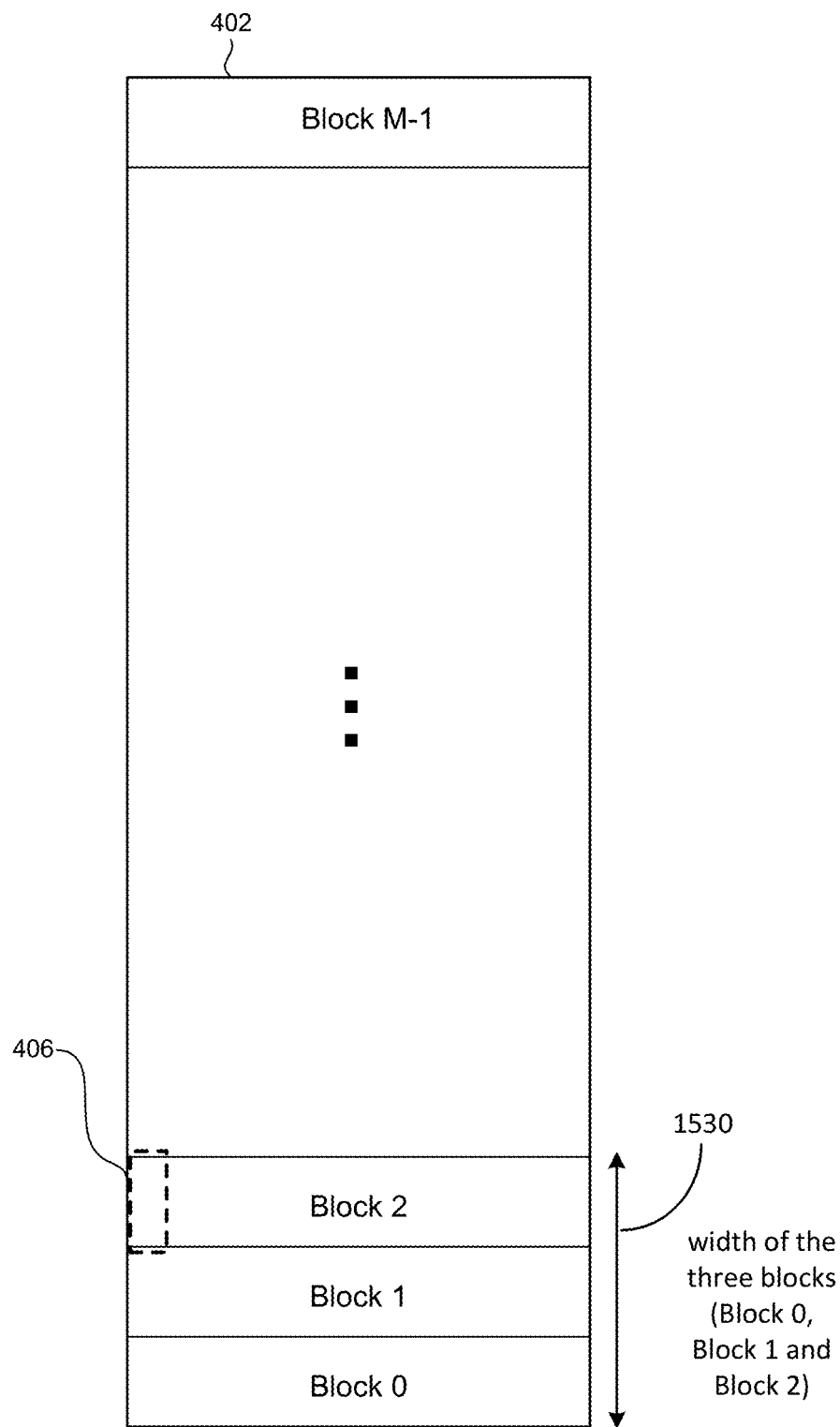
FIG. 4A is a block diagram of one plane of a memory structure.

FIG. 4A is a block diagram depicting one example organization of one plane 402 of memory structure 202. In some embodiments, memory structure 202 may include more than one plane (e.g., 2 planes, 4 planes, 8 planes, etc.). Plane 402 is divided into M blocks. In one example, each plane has about 2000 blocks. However, different numbers of blocks can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the non-volatile memory cells of a block share a common set of word lines. For example, the word lines for a block are all connected to all the vertical NAND strings for that block (e.g., a block comprises a plurality of NAND strings connected to a common set of word lines). Although FIG. 4A shows two planes 402/404, more or less than two planes can be implemented. In some embodiments, memory structure 202 includes eight planes.

Figure 4B:
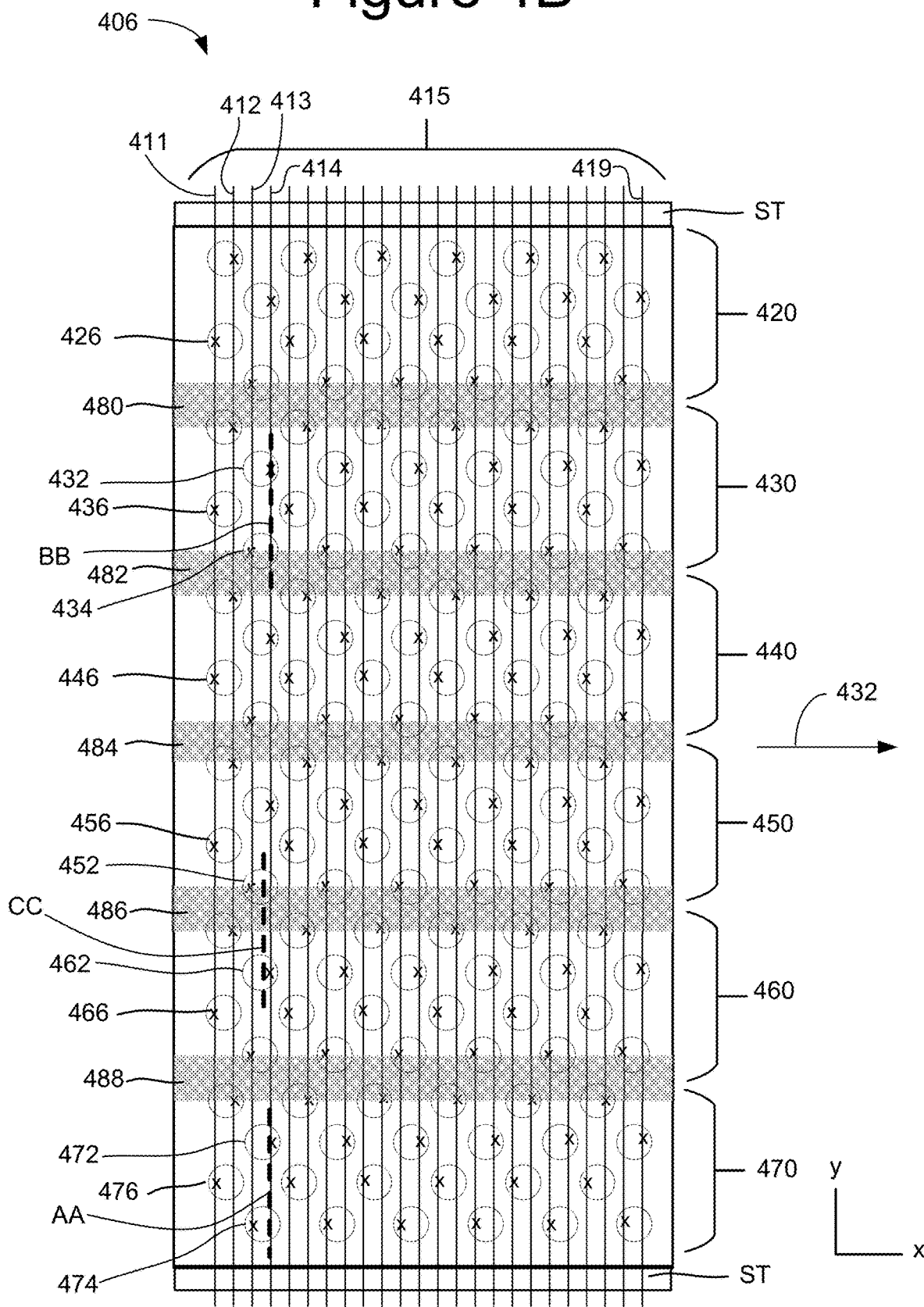
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

The top and bottom of the blocks of memory cells include ST regions. In one embodiment, the ST regions are metal sheets that separate blocks and provide an electrical connection from above memory structure 202 to the source line SL (see FIGS. 4C, 4D and 4J).

Figure 4C:
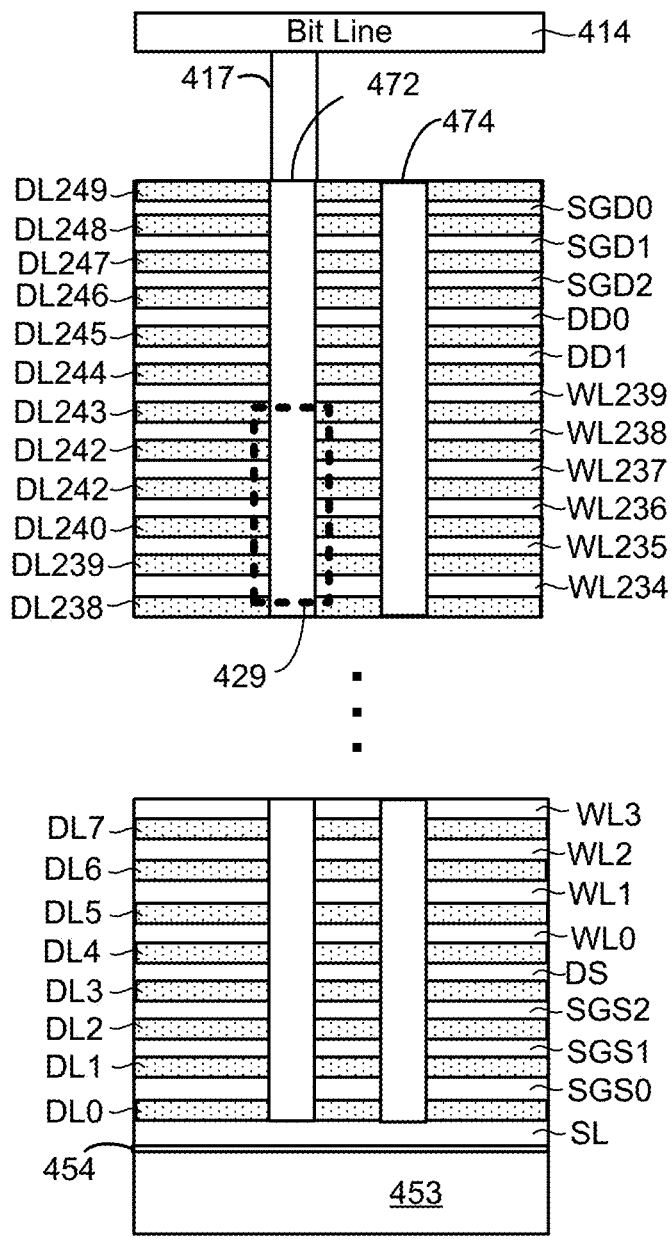
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can be implemented more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have the same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
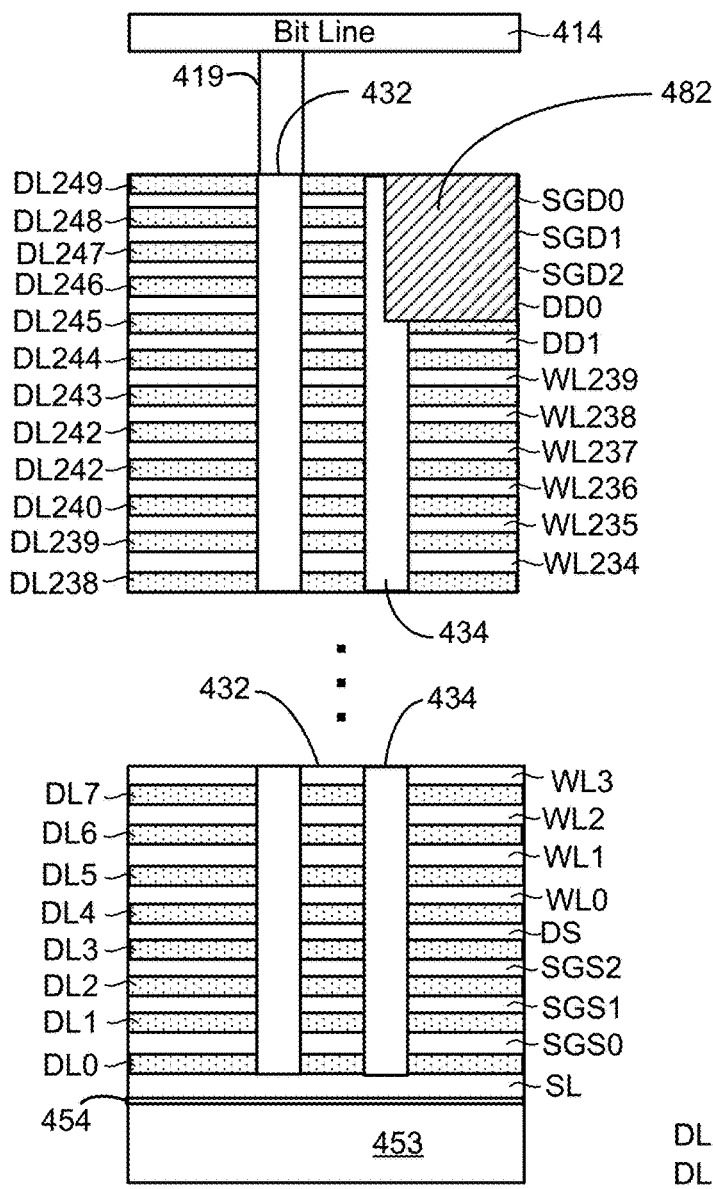
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with SiO$_2$.

Figure 4E:
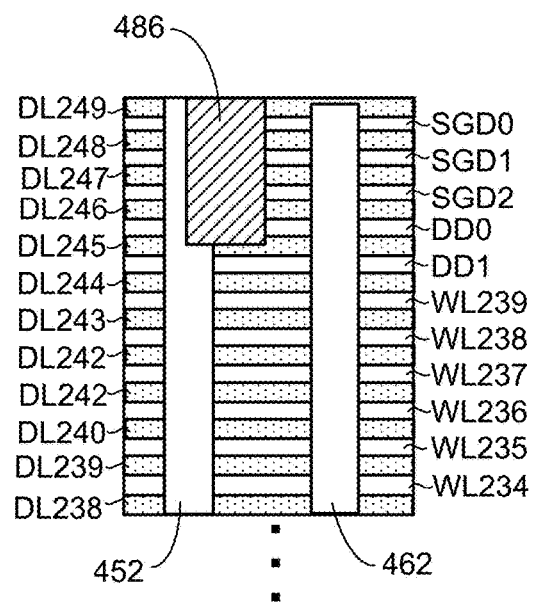
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
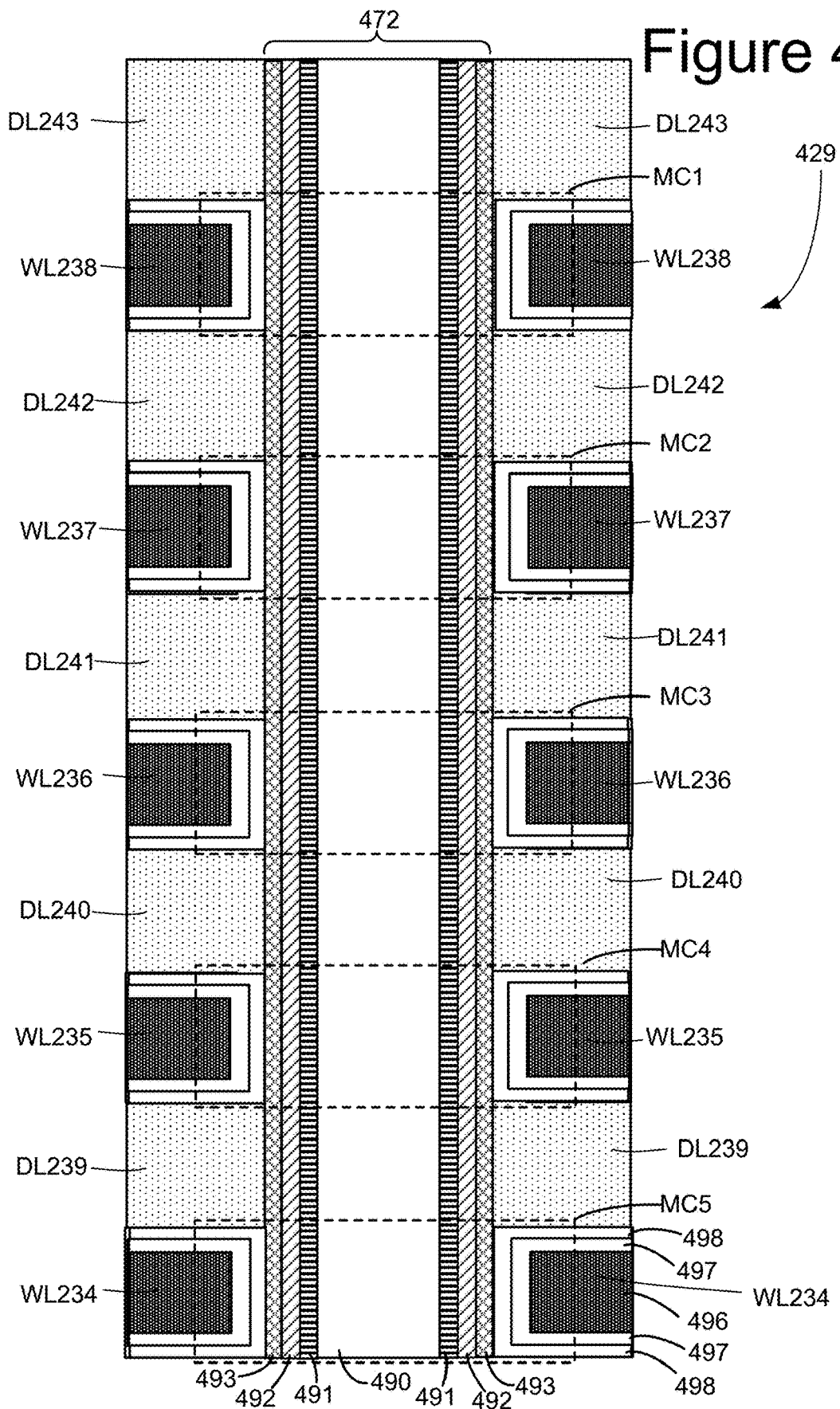
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as SiO$_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WLL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
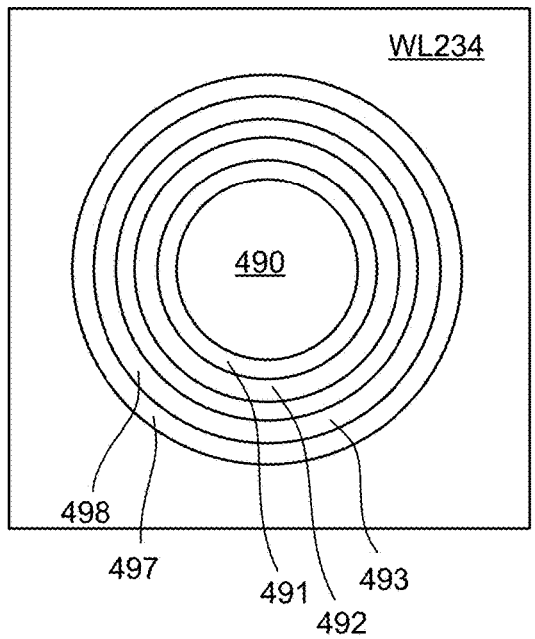
FIG. 4G depicts a cross section of a vertical column that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
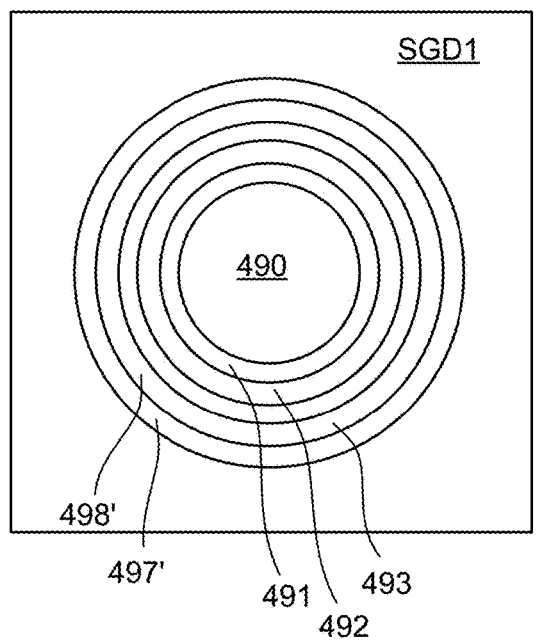
FIG. 4H depicts a cross section of a vertical column that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
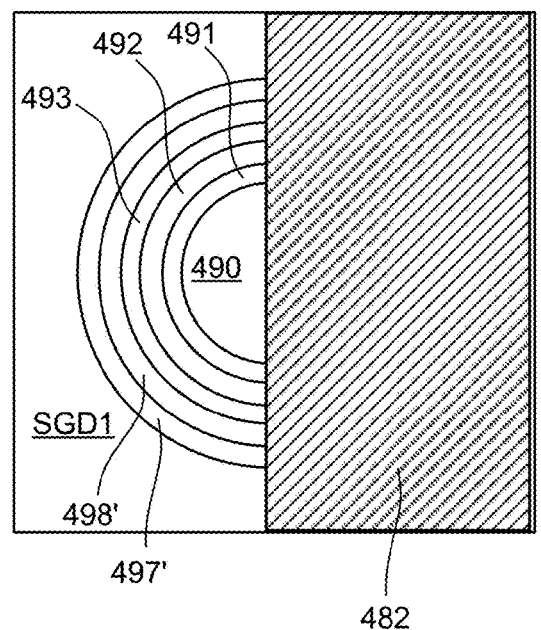
FIG. 4I depicts a cross section of a vertical column that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
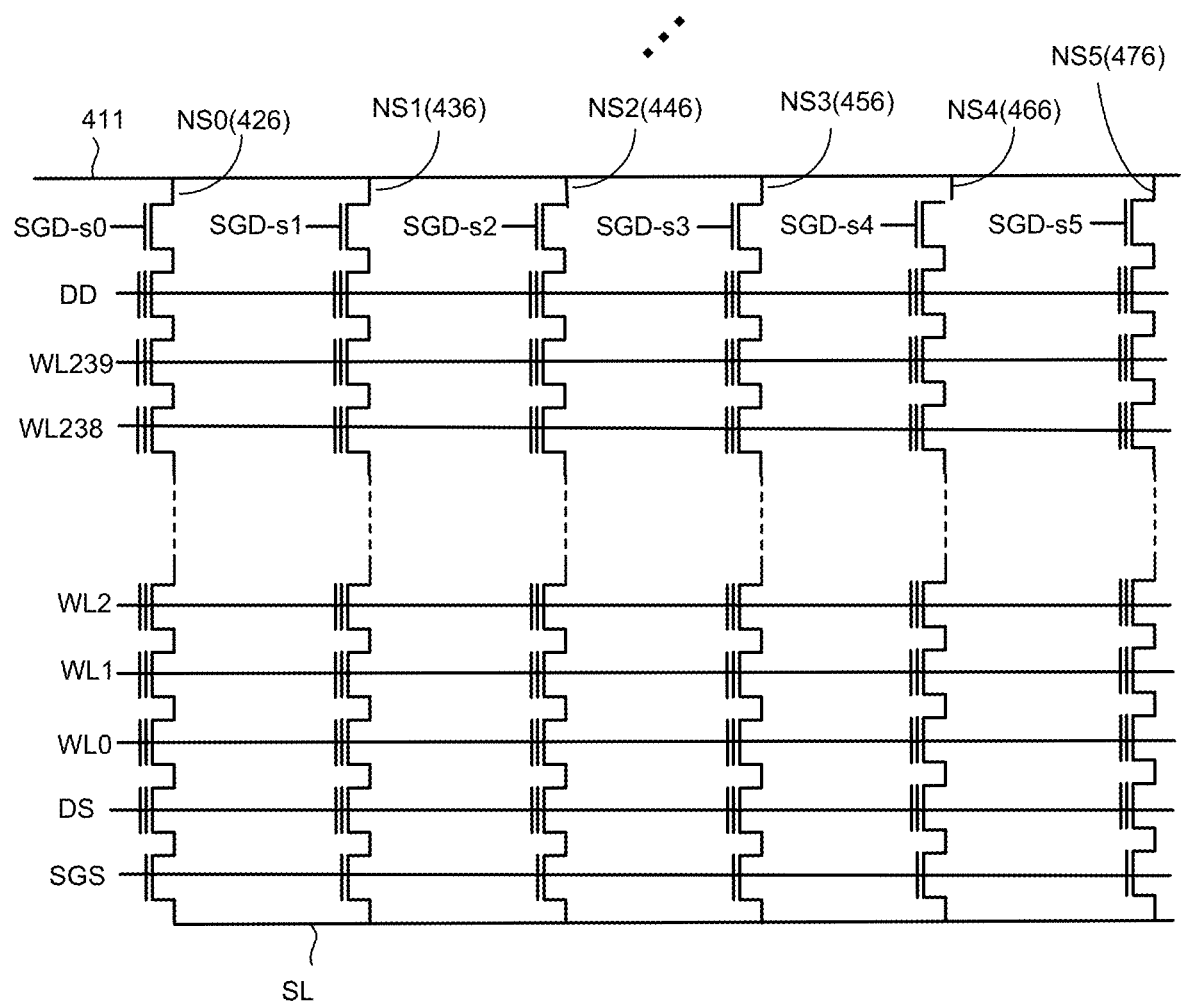
FIG. 4J is a schematic of a plurality of NAND strings in multiple sub-blocks of a same block.

FIG. 4J is a schematic diagram of a portion of the memory array 202 depicted in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
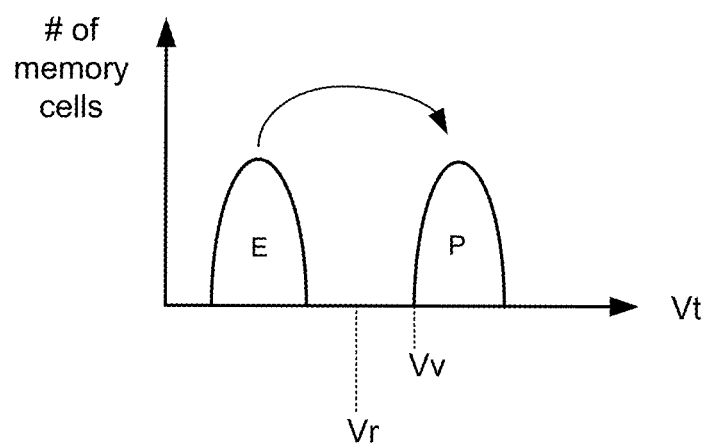
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine whether a memory cells is erased (state E) or programmed (state P). FIG. 5A also depicts verify reference voltage Vv. In some embodiments, when programming memory cells to data state P. the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
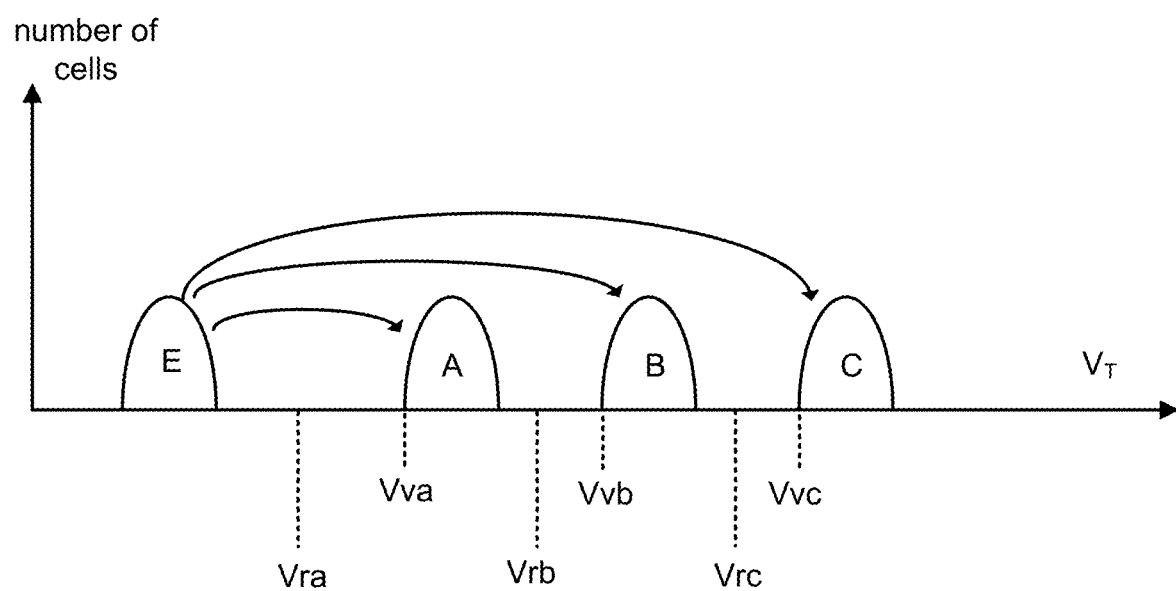
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|  | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
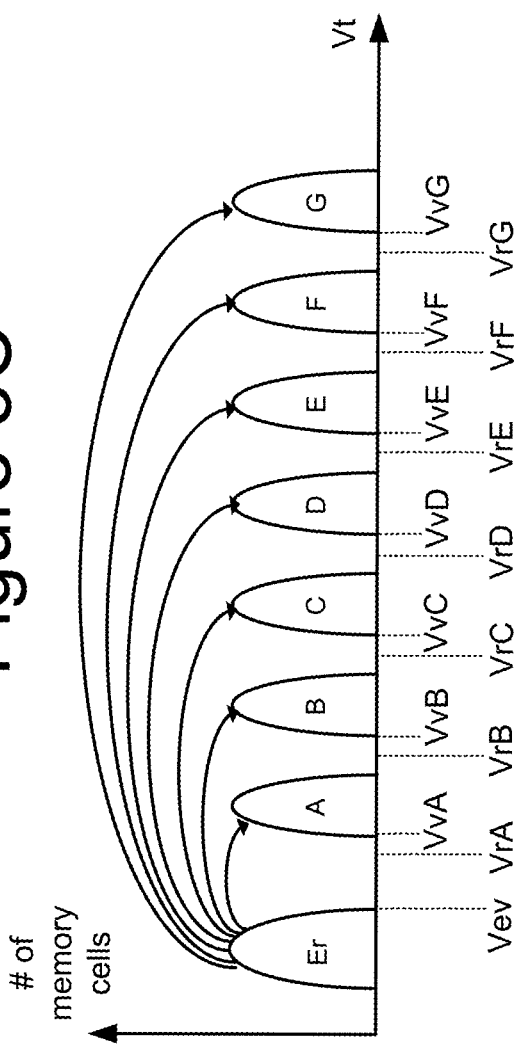
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|  | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D. the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
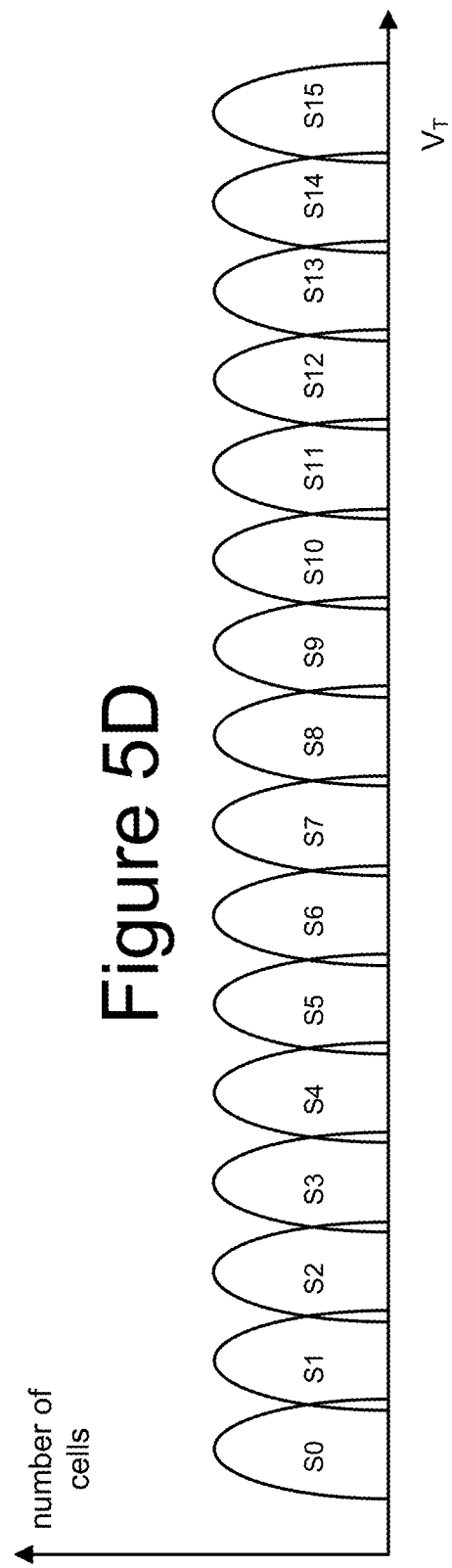
FIG. 5D depicts threshold voltage distributions.
Figure 5E:
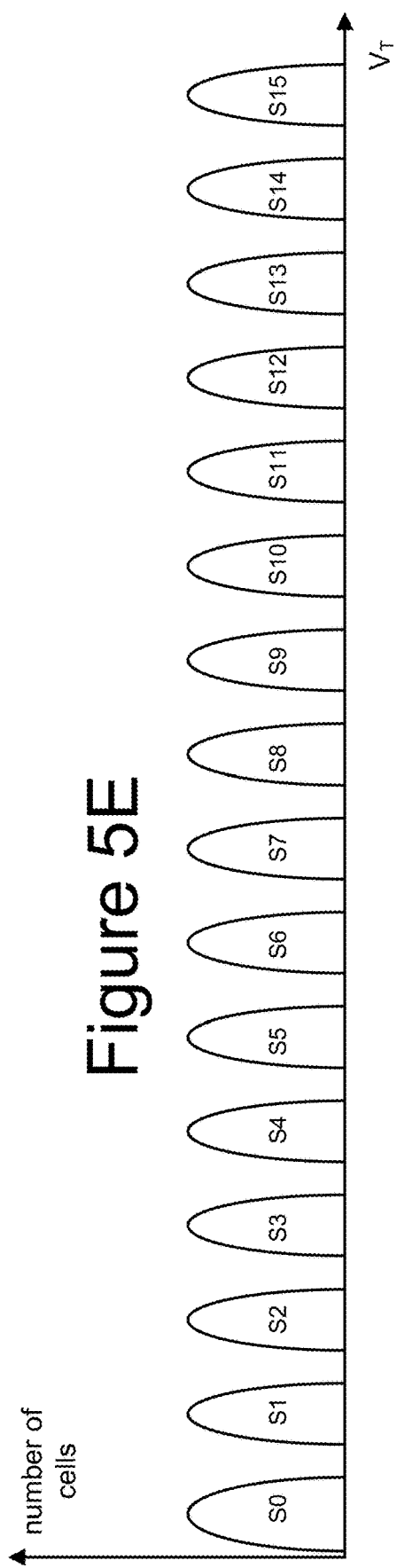
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 1  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
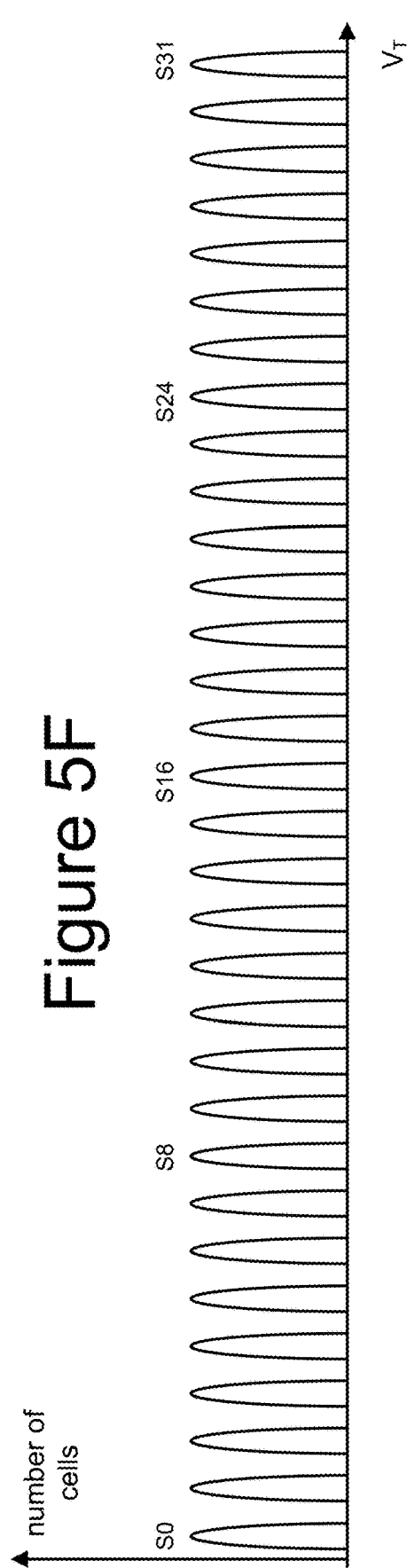
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
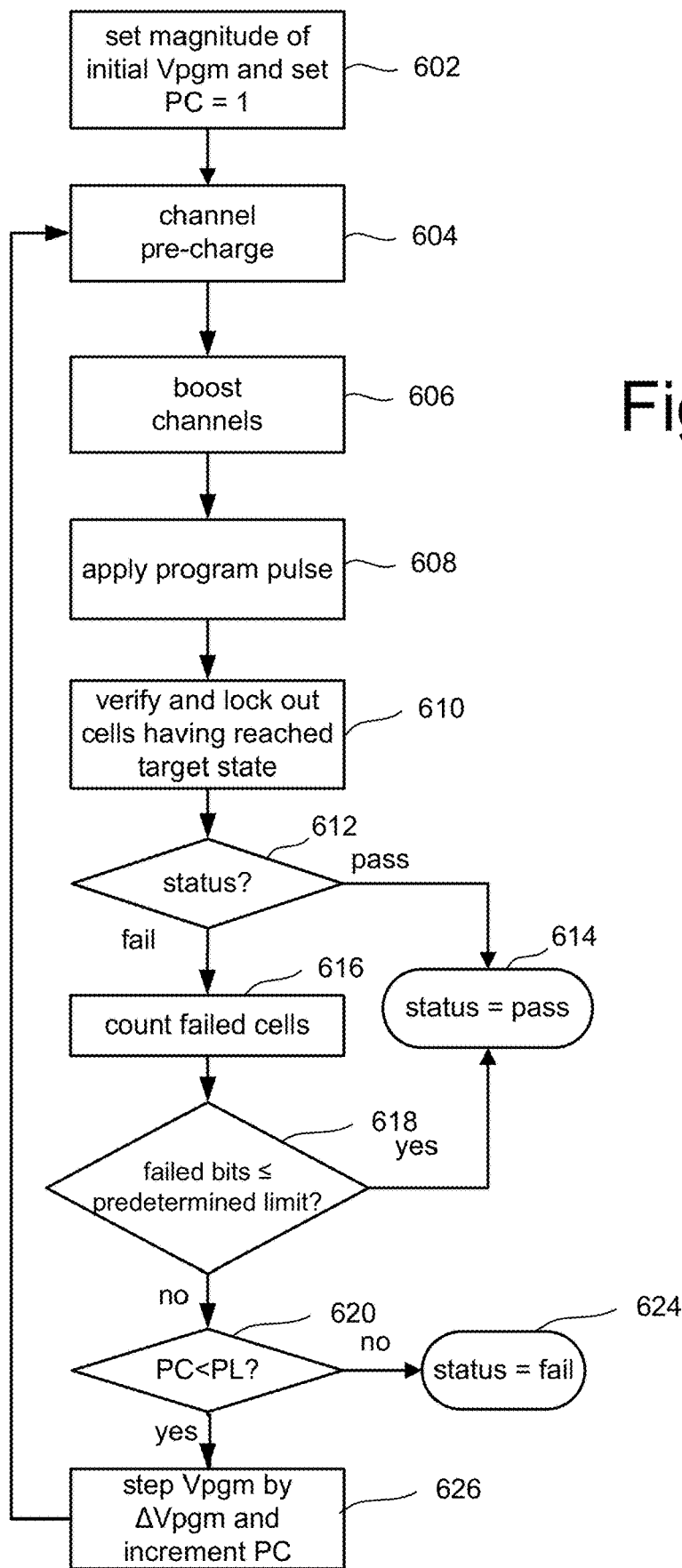
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled with the unselected NAND string. In one embodiment, for example, the channel is pre-charged to ~2 volts in step 604 and then floated. In step 606, the channel is boosted up from the 2volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well crase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
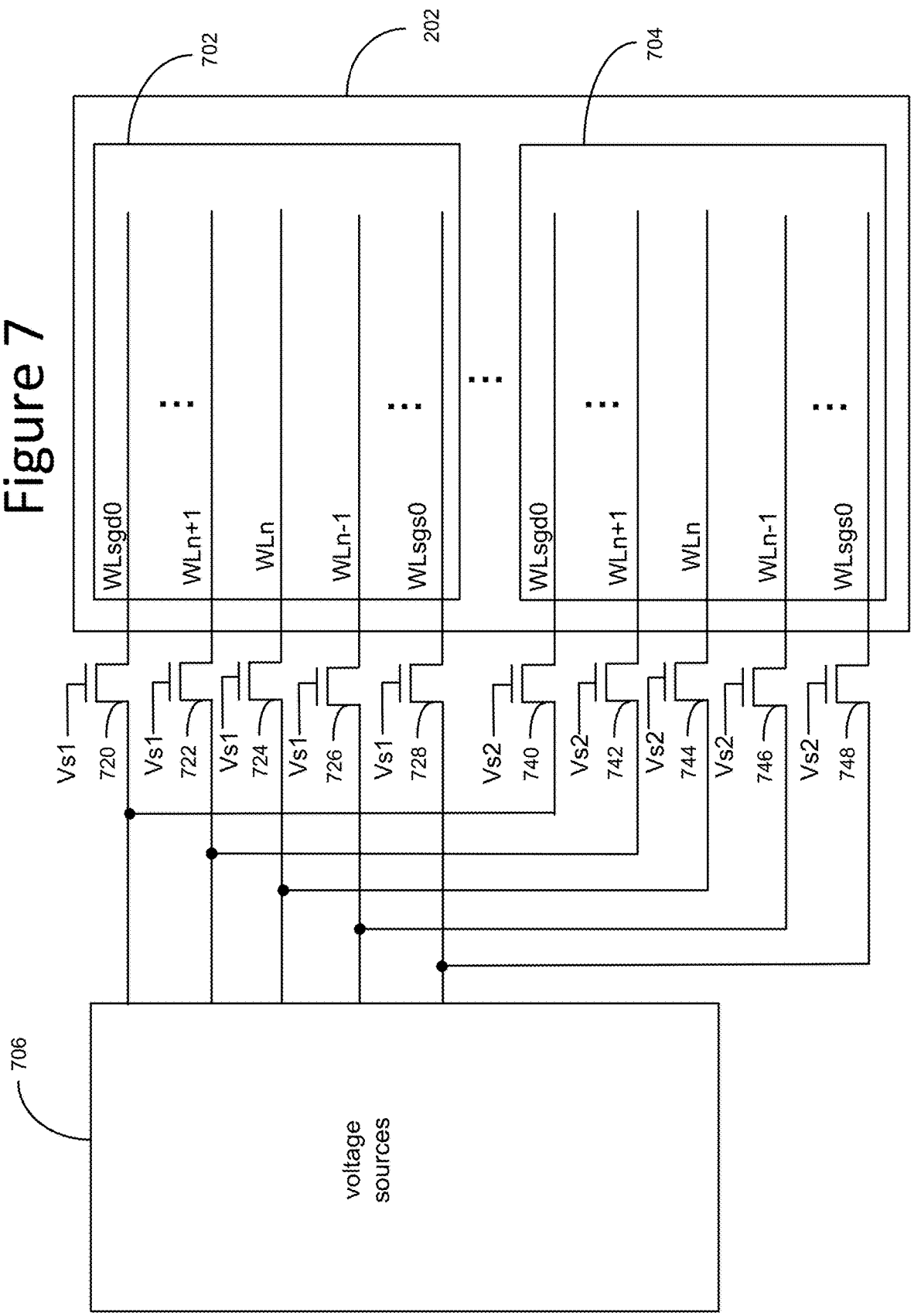
FIG. 7 is a block diagram of word line switch transistors connected to word lines of multiple blocks of memory cell.

FIG. 7 depicts a schematic diagram depicting a plurality of word line switches connected to the word lines and one or more sources of voltage. For memory array 202, FIG. 7 shows block 702 and block 704; however, more than two blocks would be included in memory array 202. FIG. 7 only shows two blocks to make the drawing easier to read. The word lines may comprise data word lines, dummy word lines and select lines. FIG. 7 shows a plurality of word lines extending across the memory. For example, for both blocks 702 and 704, the word line depicted include WLsgs0 . . . WLn-1, WLn, WLn+1, . . . WLsgd0. The other word lines of the blocks are not explicitly depicted to make the drawing easier to read. For block 702, FIG. 7 shows word lines switch transistor 720 connected to WLsgd0, word line switch transistor 722 connected to WLn+1, word line switch transistor 724 connected to WLn, word line switch transistor 726 connected to WLn 1 and word line switch transistor 728 connected to WLsgs0. For block 704, FIG. 7 shows word line transistor 740 connected to WLsgd0, word line switch transistor 742 connected to WLn+1, word line switch transistor 744 connected to WLn, word line switch transistor 746 connected to WLn-1 and word line switch transistor 748 connected to WLsgs0.

Each of the word line switch transistors 720-748 have their input terminal connected to voltage sources 706 for receiving a voltage to be transferred to the respective word lines via the output terminals. Voltage sources 706 (which can be part of the control circuit described above) includes one or more voltage sources that provide voltage signals (for programming, reading and erasing) which are transferred to the word lines via the plurality of word line switch transistors.

The control circuit (not depicted in FIG. 7), such as state machine 262, provides various selection signals (one or more selection voltages or one or more deselect voltages) to the selection terminals of the word line switch transistor. For example, signal VS1 is provided to word line switches 720, 722, 724, 726 and 728; and signal Vs2 is provided to word line switches 740, 742, 744, 746 and 748. In this manner, the word line switch transistors for a block can be turned on or turned off together so that the block is selected or not selected for a particular memory operation.

Figure 8:
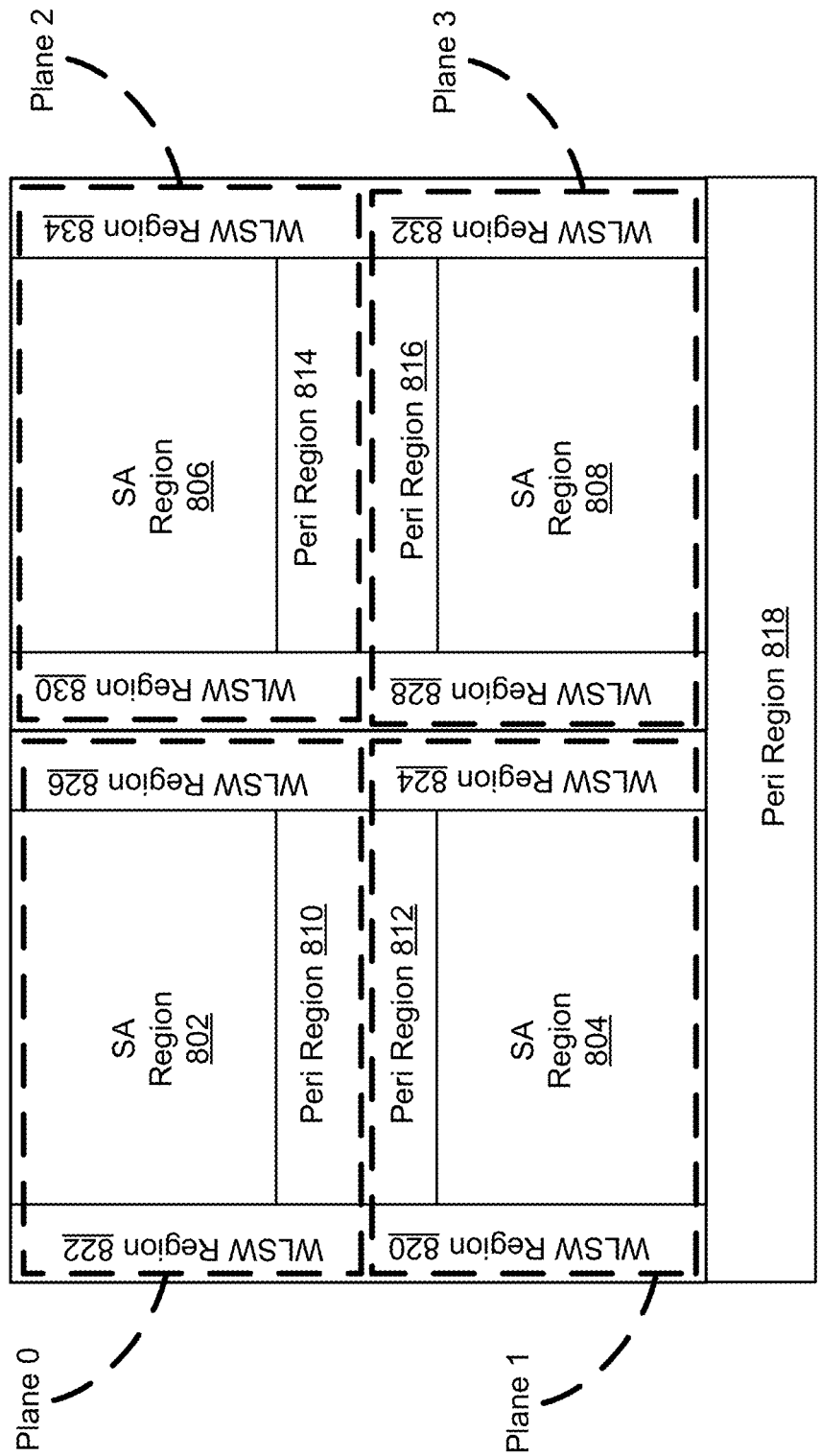
FIG. 8 is a top view of the circuits on a control die.

FIG. 8 depicts a top view of control die 211, looking down on the top surface of substrate of control die 211. The top surface of the substrate of control die 211 depicted in FIG. 8 includes one or more electrical circuits comprising the one or more control circuits described above. The top surface of the substrate of control die 211 is divided into various areas including a plurality of word line switch regions 820, 822, 824, 826, 828, 830, 832 and 834. Each of these word line switch regions includes a plurality of word line switches. Control die 211 also includes a plurality of sense amplifier regions 802, 804, 806 and 808. Each of the sense amp regions includes sense amplifiers and supporting circuits. Control die 211 further includes a plurality of peripheral circuit regions (also referred to as Peri Regions) 810, 812, 814, 816 and 818. Each of the Peri Regions includes various peripheral circuits (other than sense amplifiers and word line switch transistors) used to implement control die 211. For example, Peri Regions 810, 812, 814, 816 and 818 could include the components of system control logic 260, components of row control circuitry 220, and/or the components of column control circuitry 210 (except for sense amps 230) (see FIG. 2A and FIG. 2B).

In the embodiment of FIGS. 2B, 3A, and 3B, control die 211 of FIG. 8 is positioned below memory die 201. That is, the planes of memory structure 202 are positioned above the components depicted in FIG. 8. In one embodiment, memory structure 202 includes six planes. FIG. 8 includes dashed line boxes representing Plane 0, Plane 1, Plane 2 and Plane 3 of one embodiment of memory structure 202 positioned above the components of control die 211. Thus, FIG. 8 is one embodiment where the three dimensional non-volatile memory structure is part of a first semiconductor die (e.g., the memory die) and the one or more control circuits are part of a second semiconductor die bonded (or otherwise connected) to the first semiconductor die.

Figure 9:
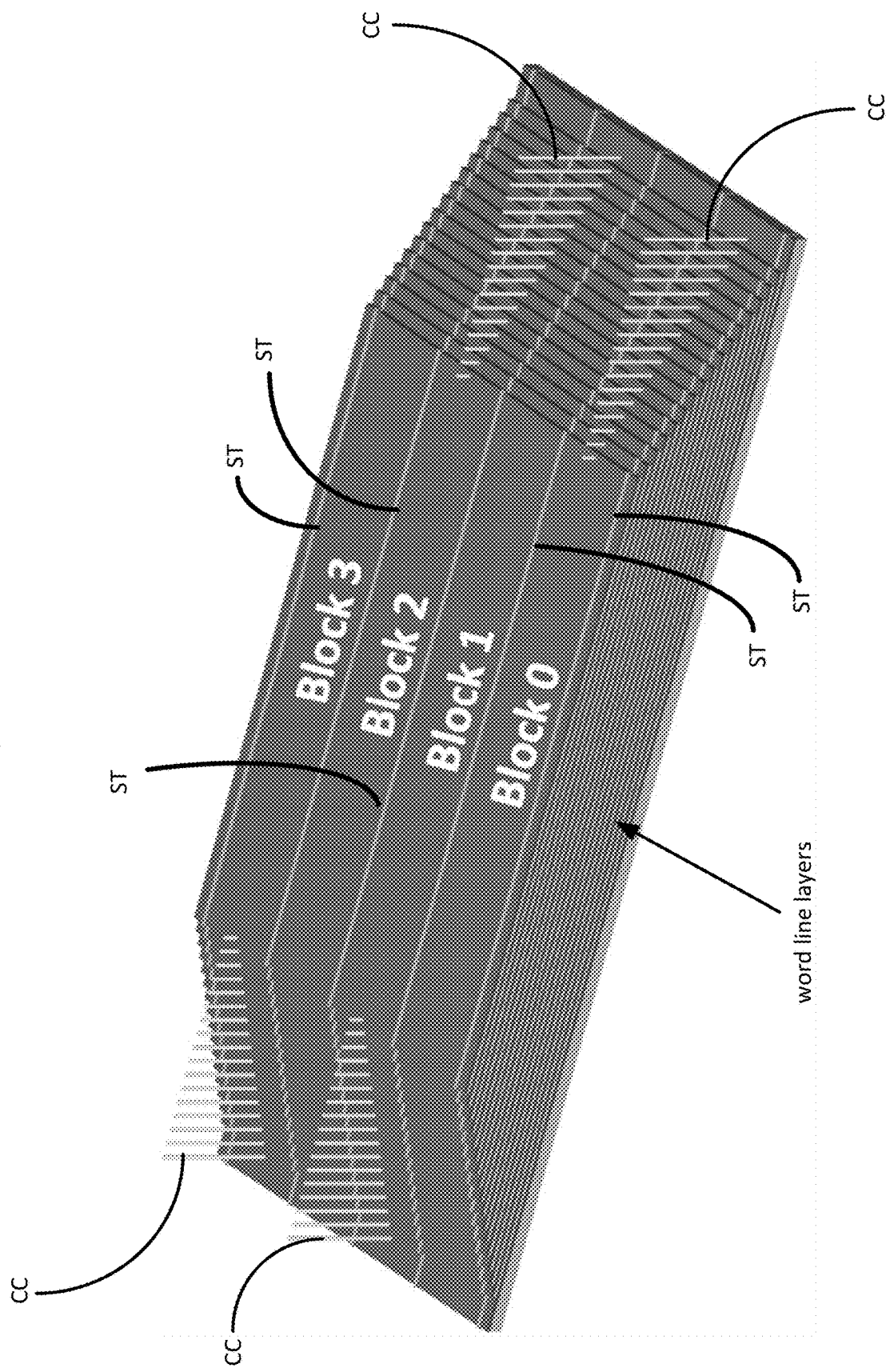
FIG. 9 is a perspective view of a portion of a three dimensional memory structure.

FIG. 9 depicts one embodiment of the structure of an example plane of memory cells of Plane 0, Plane 1, Plane 2 and Plane 3 of FIG. 8; however, the plane is turned upside down in FIG. 9 to better depict the details. As can be seen, the plane of FIG. 9 comprises a stack of alternating conductive layers and dielectric layers (see FIGS. 4C-4F) having an inverted staircase shape at a first end and an inverted staircase shape at a second end. The inverted staircase provides access to the various conductive layers (serving as word lines or word line layers) in order to connect to the conductive layers (serving as word lines or word line layers). FIG. 9 shows the connections CC (only a subset are labeled CC to keep the drawing easy to read) to the various conductive layers (serving as word lines or word line layers) at the inverted staircase regions. FIG. 9 also shows the ST regions between blocks (see FIG. 4B).

Figure 10:
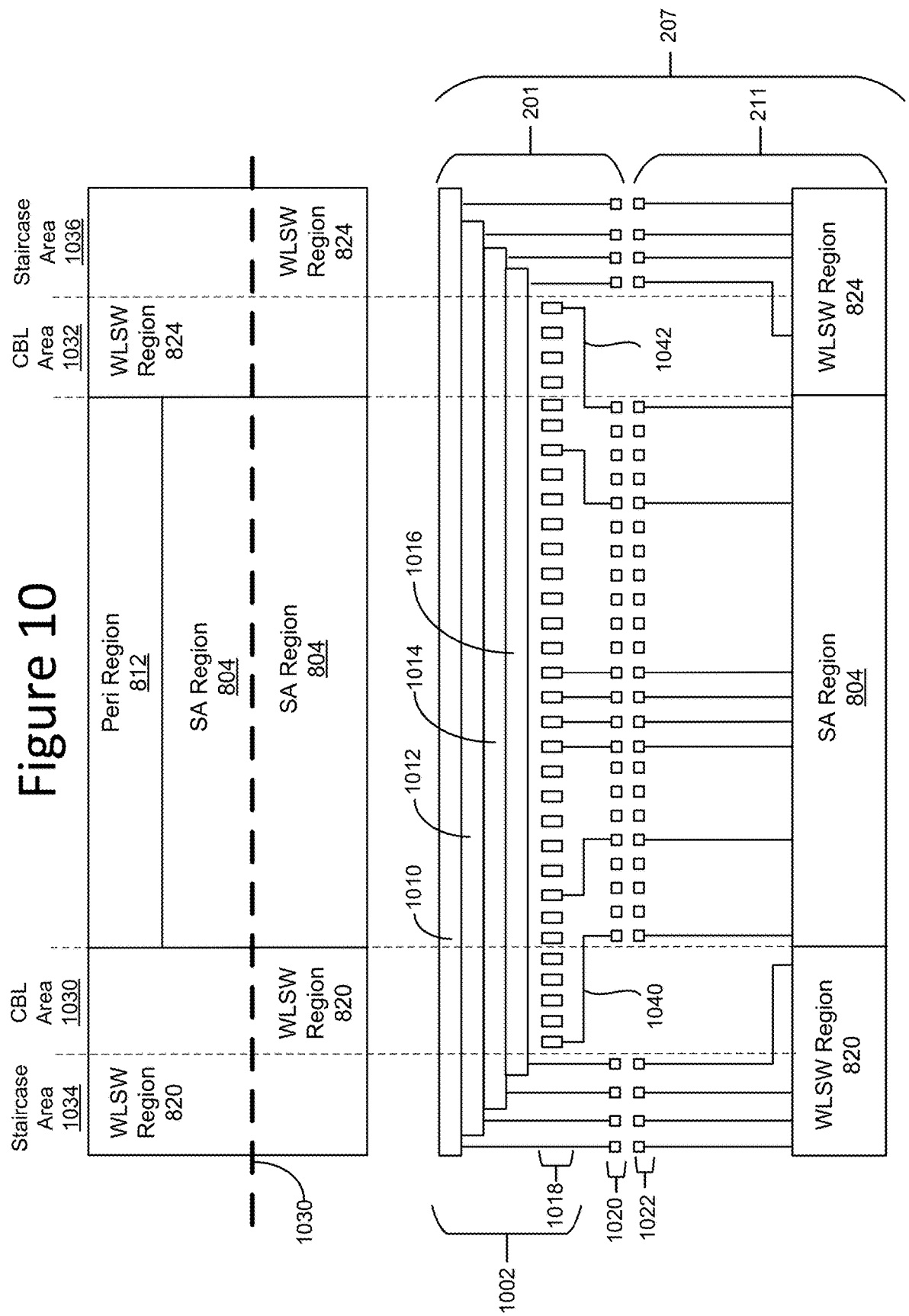
FIG. 10 is a cross section of an integrated memory assembly.

FIG. 10 shows a top view of the portion of control die 211 that is below Plane 1 (see FIG. 8) aligned with a cross section of integrated assembly 207 (including a portion of memory die 201 and a portion of control die 211) along line 1030. The portion of control die 211 is the same portion depicted in the top portion of FIG. 10 and includes a substrate that includes thereon word line switch region 820, word line switch region 824 and sense amplifier region 804. Note that for purposes of this document, terms relating to orientation with respect to the integrated memory assembly 207 are relative to the semiconductor dies. For example, regardless of whether integrated memory assembly 207 is in the orientation depicted in FIG. 10, flipped vertically or rotated, memory die 201 is referred to as being above control die 211.

The portion of memory die 201 depicted in the cross section on the bottom of FIG. 10 includes a non-volatile memory array 1002 forming Plane 1, includes a plurality of word lines 1010, 1012, 1014 and 1016. Only four word lines are depicted to make the drawing easier to read; however, in most embodiments more than four word lines would be implemented (as discussed above). To make the drawing easier to read, FIG. 10 does not show the dielectric regions between the word lines or the memory holes. Below the word lines are a plurality of bit lines 1018. Below bit lines 1018 are a set of bond pads 1020 for memory die. In one embodiment below the memory array word lines and above the bond pads are two metal line layers referred to as M1 and M2 (not explicitly depicted in FIG. 10) that are configured to connect the word lines to the first set of bond pads.

Above word line switch region 520, word line switch region 824, and sense amplifier region 704, control die 211 also includes a plurality of bond pads 1022 that line up with bond pads 1020 in order to bond control die 211 to control die 201. That is, in one embodiment, each (or a subset) of bond pads 1022 is bonded to a corresponding and aligned bond pad of plurality bond pads 1020. Below bond pads 1022 and above word line switch region 520/word line switch region 824/sense amplifier region 704 are a plurality of metal line layers, which will be discussed in more detail below, that are configured to connect the word line switch transistors to bond pads 1022 for communication of electrical signals from the word line switch transistors to the word lines via bond pads 1022/1020 and metal layers M1 and/or M2.

As can be seen from FIG. 10, the word lines (1010, 1012, 1014, 1016) are arranged in an inverted staircase structure such that word line length increases from bottom to top of the three dimensional non-volatile memory structure. For example, the two ends of the stack of word lines (1010, 1012, 1014, 1016) are in the shape of an inverted staircase. This portion of where the staircases are positioned are referred to as staircase areas, which in FIG. 10 includes staircase area 1034 and staircase area 1036. FIG. 10 shows how the staircase areas line up over the word line switch regions. Staircase areas 1034 and 1036 can also be referred to as word line hook up regions because control die 211 will send signals that connect to the word lines in these word line hook up regions/staircase areas 1034/1036. As can be seen, the staircase areas 1034/1036 are at end portions of the memory array. Thus, the word line switch regions 820 and 824 are positioned below the staircase areas, below the word line hook up regions, below end portions of the memory arrays, as well as below and between the planes.

Figure 11:
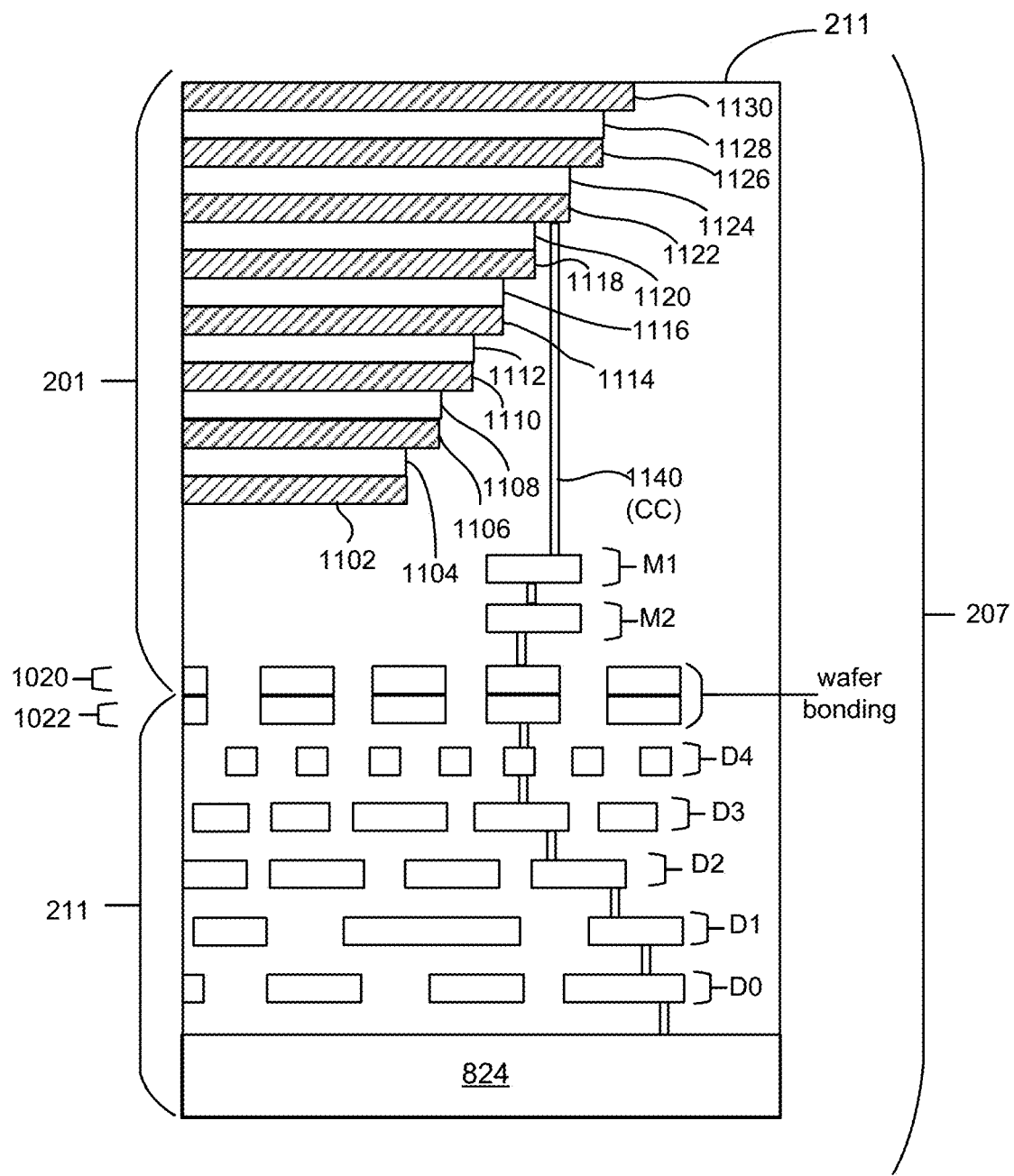
FIG. 11 is a cross section of an integrated memory assembly.

FIG. 11 depicts another cross section of memory assembly 207 for the same embodiment as FIG. 10. As can be seen, integrated memory assembly 207 includes memory die 201 bonded to control die 211 via bond pads 1020 and 1022. Memory die 201 includes a memory array comprising a plurality of word lines 1102, 1106, 1110, 1114, 1118, 1122, 1126 and 1130 (more word lines are depicted than in FIG. 10). Although eight word lines are depicted in FIG. 11, most embodiments will include more than eight word lines. Between the word line layers are dielectric layers 1104, 1108, 1112, 1116, 1120, 1124 and 1128. FIG. 11 shows that below the memory array and above the bond pads 1020, memory die 201 includes two metal line layers M1 and M2. In other embodiments more than two metal line layers can be used. As depicted in FIG. 11, metal line layer M2 is below metal line layer M1 such that metal line layer M2 is between metal line layer M1 and bottom pads 1020. Similarly, metal line layer M1 is between the memory array and metal line layer M2. Metal line layers M1 and M2 are horizontal metal line layers. FIG. 11 also shows control die 211 including five metal line layers above the substrate (see word line switch region 824) and below bond pads 1022. For example, FIG. 11 shows a bottom metal line layer D0. Above metal line layer D0 is metal line layer D1. Above metal line layer D1 is metal line layer D2. Above metal line layer D2 is metal line layer D3. Above metal line layer D3 is metal line layer D4.

FIG. 11 depicts an example of an electrical connection from a word line switch transistor (also referred to as a word line switch) in word line switch region 824 to a word line (e.g., word line 1120). For example, the word line switch transistor (e.g., in one embodiment is a single transistor) in word line switch region 824 is connected to metal layer D0, to metal layer D1, to metal layer D2, to metal layer D3, to metal layer D4, to bond pad 1022, to bond pad 1020, to metal layer M2, to metal layer M1, to CC line 1140, to word line 1122.

Looking back at FIG. 10, the width of word line switch region 820 is wider than corresponding staircase area 1034, and the width of word line switch regions 824 is wider than corresponding staircase area 1036. That is because there is not enough room to position all word line switch transistors directly below the word line hook up regions of the staircase areas. To compensate, a subset of word line switch transistors can be positioned in word line switch region 820/824 but horizontally offset from staircase areas 1034/1036. The area that is horizontally offset from staircase area 1034 is referred to as CBL (crossed bit-line) area 1030 and the area that is horizontally offset from staircase area 1036 is referred to as CBL area 1032. Thus, a subset of word line switch transistors that will be positioned in word line switch region 820 will be located in CBL area 1030 and a subset of word line switch transistors that will be positioned in word line switch region 824 will be located in CBL area 1032. Those word line switch transistors in CBL area 1030/1032 will need to be connected to metal lines in metal line layers D0/D1/D2/D3/D4 to form horizontal connections to vertical lines or vias that connect to the bond pads 1022 below staircase areas 1034/1036. As more word line switch transistors are positioned in CBL areas 1030/1032 (horizontally offset from staircase area 1034/1036), there may not be enough room on control die 211 to implement all the needed horizontal metal lines in D0/D1/D2/D3/D4 to implement all the needed horizontal metal lines that connect the word line switch transistors to the corresponding bond pads (and then to the corresponding word lines) and to implement any needed pass through signals for control die 211. One solution to this shortage of area is to make control die 211 and memory die 201 larger. However, making the dies larger increases cost and may make the dies physically too large for some applications.

To overcome the above-described shortage of area for the needed metal lines, it is proposed to arrange the word line switches in groups of X word line switches such that each group of X word line switches is positioned in a line under Y blocks of non-volatile memory cells and has a length that is equal to the width of the Y blocks of non-volatile memory cells, where X>Y. More details are provided below with respect to FIG. 15.

Figure 12:
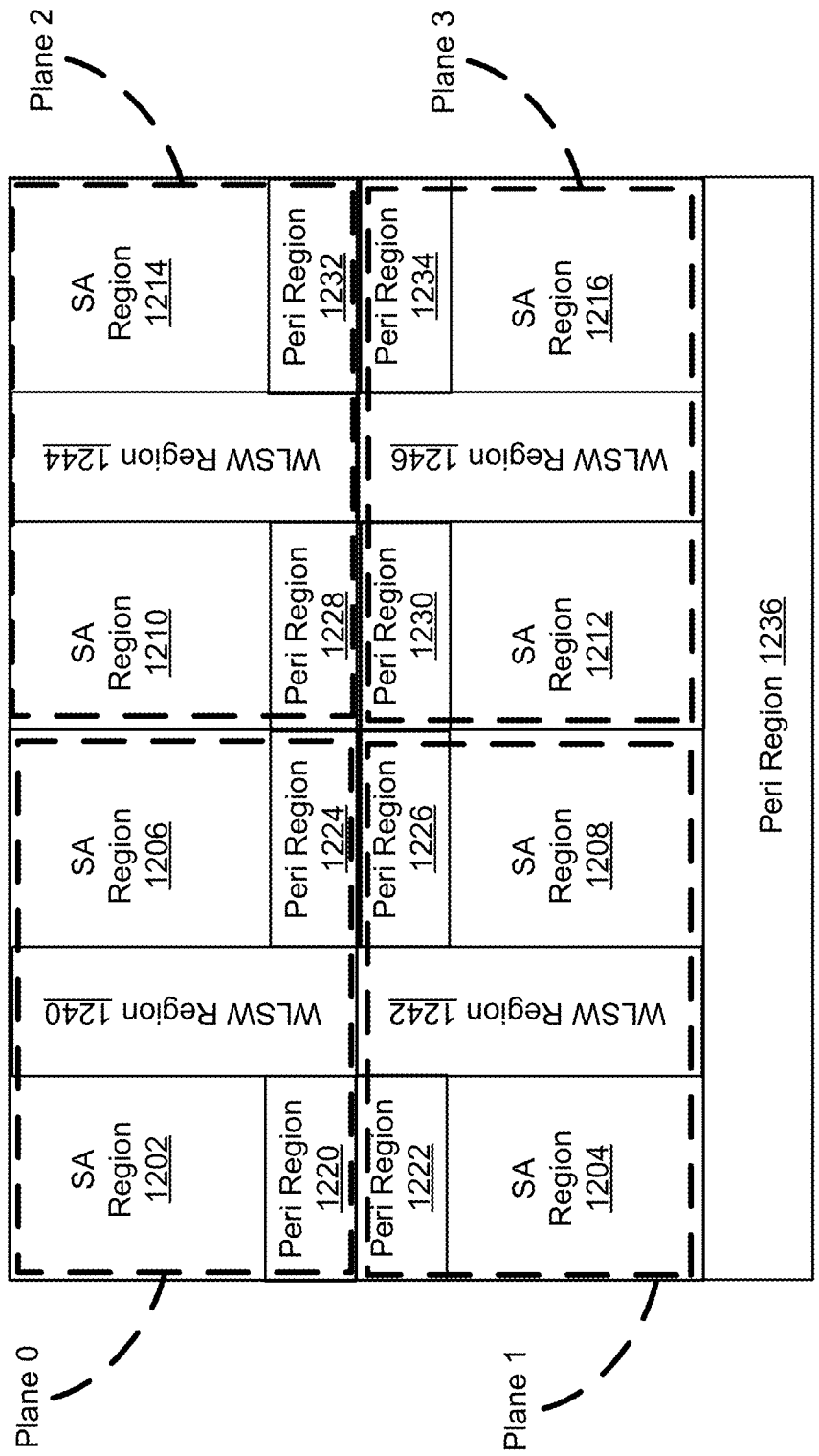
FIG. 12 is a top view of the circuits on a control die.

FIG. 12 depicts a top view of another embodiment of control die 211, looking down on the top surface of substrate of control die 211. The top surface of the substrate of control die 211depicted in FIG. 12 includes one or more electrical circuits comprising the one or more control circuits described above. The top surface of the substrate of control die 211 is divided into various areas including a plurality of word line switch regions 1240, 1242, 1244 and 1246. Each of these word line switch regions includes a plurality of word line switches. Control die 211 also includes a plurality of sense amplifier regions 1202, 1204, 1206, 1208, 1210, 1212, 1214 and 1216. Each of the sense amp regions includes sense amplifiers and supporting circuits. Control die 211 further includes a plurality of peripheral circuit regions (also referred to as Peri Regions) 1220, 1222, 1224, 1226, 1228, 1230, 1232, and 1234. Each of the Peri Regions includes various peripheral circuits (other than sense amplifiers and word line switch transistors) used to implement control die 211. For example, the Peri Regions could include the components of system control logic 260, components of row control circuitry 220, and/or the components of column control circuitry 210 (except for sense amps 230) (see FIG. 2A and FIG. 2B).

In the embodiment of FIGS. 2B, 3A, and 3B, control die 211 of FIG. 8 is positioned below memory die 201. That is, the planes of memory structure 202 are positioned above the components depicted in FIG. 8. In one embodiment, memory structure 202 includes six planes. FIG. 12 includes dashed line boxes representing Plane 0, Plane 1, Plane 2 and Plane 3 of one embodiment of memory structure 202 positioned above the components of control die 211. Thus, FIG. 12 is one embodiment where the three dimensional non-volatile memory structure is part of a first semiconductor die (e.g., the memory die) and the one or more control circuits are part of a second semiconductor die bonded (or otherwise connected) to the first semiconductor die.

Figure 13:
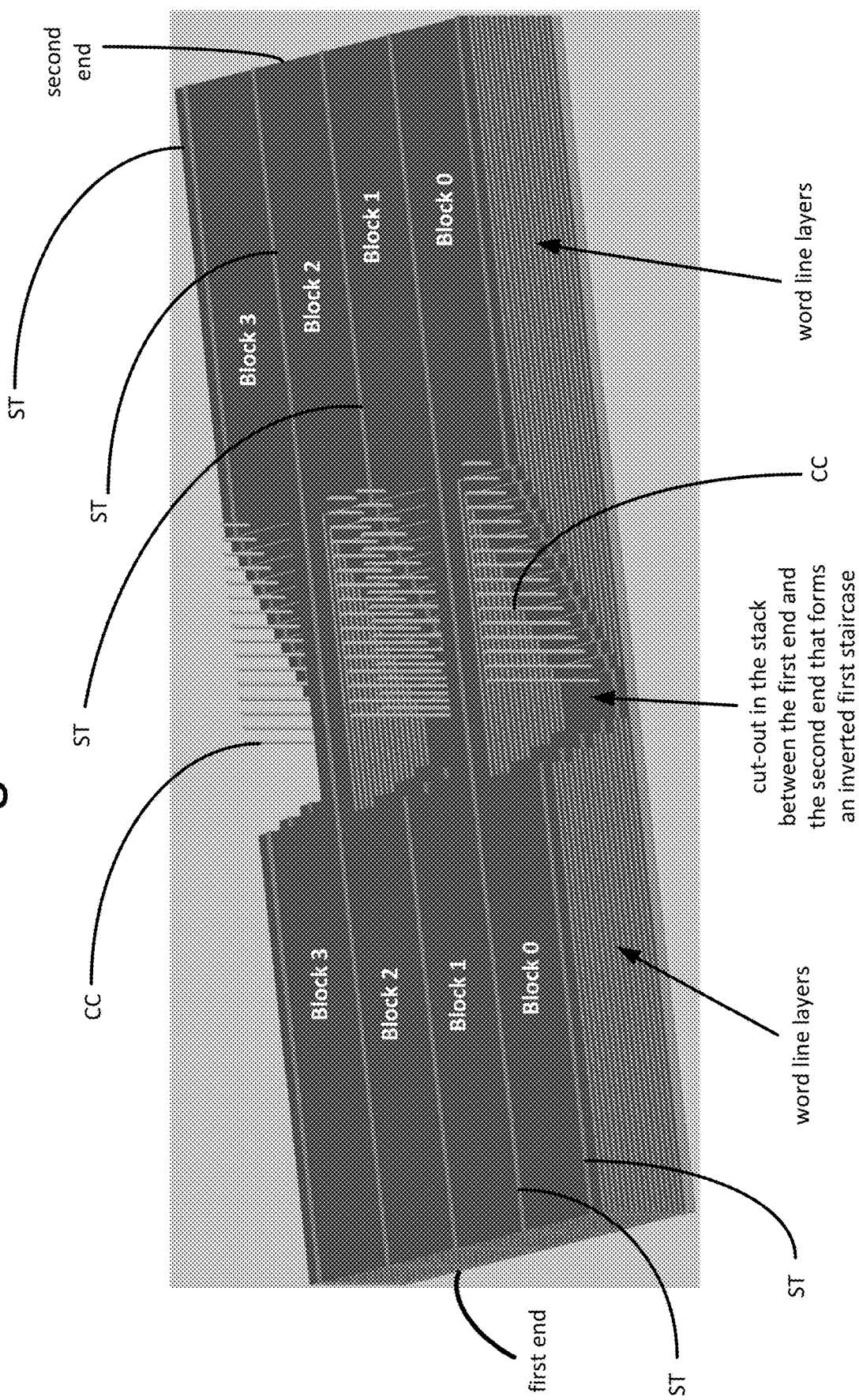
FIG. 13 is a perspective view of a portion of a three dimensional memory structure.

FIG. 13 depicts one embodiment of the structure of an example plane of memory cells of Plane 0, Plane 1, Plane 2 and Plane 3 of FIG. 12; however, the plane is turned upside down in FIG. 13 to better depict the details. As can be seen, the plane of FIG. 13 comprises a stack of alternating conductive layers and dielectric layers (see FIGS. 4C-4F). The plane has a first end and a second end. The stack of alternating conductive layers and dielectric layers has a cut-out in the stack between the first end and the second end that forms an inverted staircase of word lines (conductive layers) with respect to the position of the one or more control circuits. Thus, as compared to the embodiment of FIG. 9 that has the staircase at the ends of the plane, the embodiment of FIG. 13 has the staircase in the middle of the plane and the word line switch transistors on the control die are positioned below the staircase in the middle of the plane. FIG. 13 shows the connections CC (only a subset are labeled CC to keep the drawing easy to read) to the various conductive layers (serving as word lines or word line layers) at the inverted staircase regions. FIG. 13 also shows the ST regions between blocks (see FIG. 4B).

Figure 14:
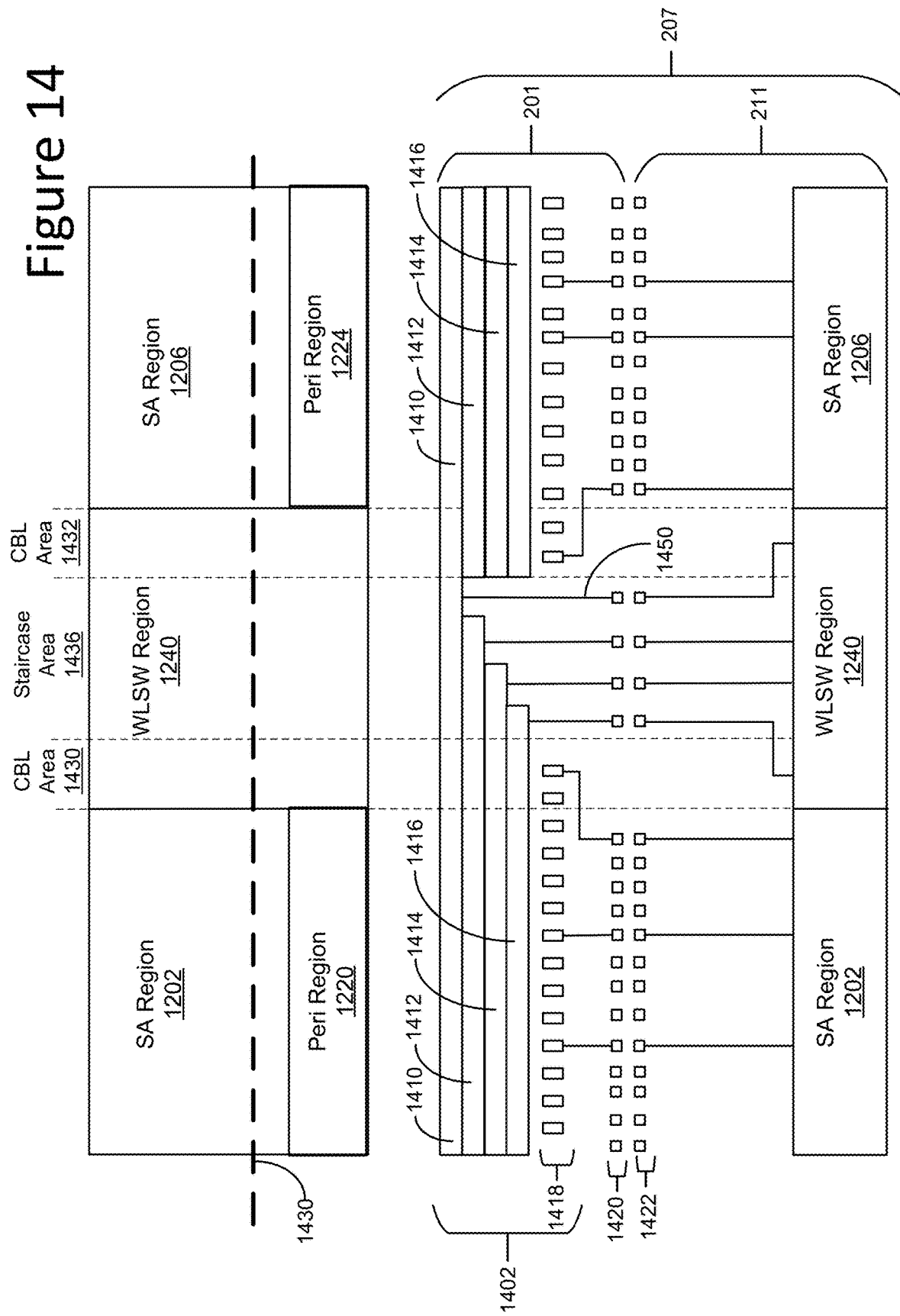
FIG. 14 is a cross section of an integrated memory assembly.

FIG. 14 shows a top view of the portion of control die 211 that is below Plane 0 (see FIG. 13) aligned with a cross section of integrated assembly 207 (including a portion of memory die 201 and a portion of control die 211) along line 1430, for the embodiment of FIGS. 12 and 13. The portion of control die 211 is the same portion depicted in the top portion of FIG. 14 and includes a substrate that includes thereon sense amplifier region 1202, word line switch region 1240, and sense amplifier region 1206. The portion of memory die 201 depicted in the cross section on the bottom of FIG. 14 includes a non-volatile memory array 1402 forming Plane 0, includes a plurality of word lines 1410, 1412, 1414 and 1416. Only four word lines are depicted to make the drawing easier to read; however, in most embodiments more than four word lines would be implemented (as discussed above). To make the drawing easier to read, FIG. 14 does not show the dielectric regions between the word lines or the memory holes. Below the word lines are a plurality of bit lines 1418. Below bit lines 1418 are a set of bond pads 1420 for memory die. In one embodiment below the memory array word lines and above the bond pads are two metal line layers referred to as M1 and M2 (not explicitly depicted in FIG. 14) that are configured to connect the word lines to the first set of bond pads.

Above sense amplifier region 1202, word line switch region 1240, and sense amplifier region 1206, control die 211 also includes a plurality of bond pads 1422 that line up with bond pads 1420 in order to bond control die 211 to control die 201. That is, in one embodiment, each (or a subset) of bond pads 1422 is bonded to a corresponding and aligned bond pad of plurality bond pads 1420. Below bond pads 1422 and above sense amplifier region 1202, word line switch region 1240, and sense amplifier region 1206 are a plurality of metal line layers (e.g., D0, D1, D2, D3and D4) that are configured to connect the word line switch transistors to bond pads 1422 for communication of electrical signals from the word line switch transistors to the word lines via bond pads 1422/1420 and metal layers M1 and/or M2.

As can be seen from FIG. 14, the word lines (1410, 1412, 1414, 1416) are arranged in an inverted staircase structure for accessing and connecting to the word lines. The location of where the staircases are positioned are referred to as staircase areas, which in FIG. 14 includes staircase area 1436. FIG. 14 shows how the staircase areas line up over the word line switch regions. Staircase area 1436 can also be referred to as word line hook up regions because control die 211 will send signals that connect to the word lines in these word line hook up region. As can be seen, word line switch region 1240 is positioned below staircase area 1436. The connections from the word line switch transistors to the word lines is similar in structure as described above with respect to FIG. 11; for example, the word line switch transistor (e.g., in one embodiment is a single transistor) in word line switch region 1240 is connected to metal layer D0, to metal layer D1, to metal layer D2, to metal layer D3, to metal layer D4, to bond pad 1022, to bond pad 1020, to metal layer M2, to metal layer M1, to CC line 1450, to word line 1410.

The width of word line switch region 1240 is wider than corresponding staircase area 1436 because, in some embodiments, there is not enough room to position all word line switch transistors directly below the word line hook up regions of the staircase areas. To compensate, a subset of word line switch transistors can be positioned in word line switch region 1436 but horizontally offset from staircase areas 1436. The area that is horizontally offset from staircase area 1436 is referred to as CBL areas 1430/1432. Thus, a subset of word line switch transistors that will be positioned in word line switch region 1240 will be located in CBL areas 1430/1432. Those word line switch transistors in CBL area 1430/1432 will need to be connected to metal lines in metal line layers D0/D1/D2/D3/D4 to form horizontal connections to vertical lines or vias that connect to the bond pads 1422 below staircase area 1436. As more word line switch transistors are positioned in the CBL areas (horizontally offset from the staircase area), there may not be enough room on control die 211 to implement all the needed horizontal metal lines in D0/D1/D2/D3/D4 to implement all the needed horizontal metal lines that connect the word line switch transistors to the corresponding bond pads (and then to the corresponding word lines) and to implement any needed pass through signals for control die 211. One solution to this shortage of area is to make control die 211 and memory die 201 larger. However, making the dies larger increases cost and may make the dies physically too large for some applications. To overcome the above-described shortage of area for the needed metal lines, it is proposed to arrange the word line switches in groups of X word line switches such that each group of X word line switches is positioned in a line under Y blocks of non-volatile memory cells and has a length that is equal to the width of the Y blocks of non-volatile memory cells, where X>Y. More details are provided below with respect to FIG. 15.

Figure 15:
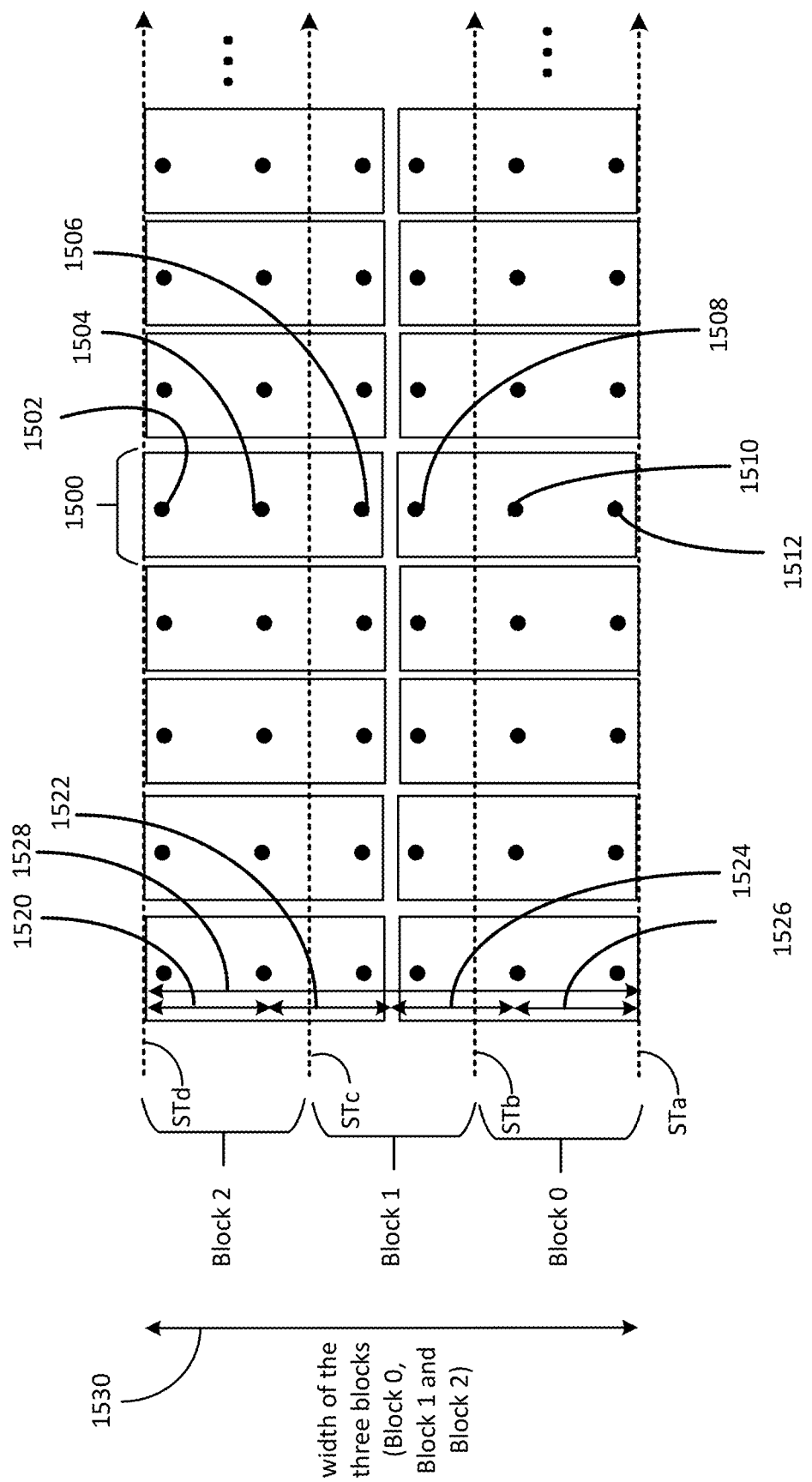
FIG. 15 depicts word line switches arranged in columns of four word line switches, each column of four word line switches has a length equal to a width of three blocks.

FIG. 15 depicts a portion of a word line switch regions, such as word line switch regions 820, 822, 824, 826, 828, 830, 832 and 834 of FIG. 8 and word line switch regions 1240, 1242, 144 and 1246 of FIG. 12. FIG. 15 shows one row of columns of word line switch transistors. Each column includes four word line switch transistors. In some embodiments, each word line switch regions will include multiple rows of the structure depicted in FIG. 15. One example column is labeled with reference number 1500. Column 1500 includes four word line switch transistors positioned in a line. Terminal 1502 is the drain of the first word line switch transistor, and is connected to a word line. Terminal 1504 is a shared source for the first word line switch transistor and the second word line switch transistor, which is connected to a source of voltage. Terminal 1506 is the drain of the second word line switch transistor, and is connected to a word line. Terminal 1508 is the drain of the third word line switch transistor, and is connected to a word line. Terminal 1510 is a shared source for the third word line switch transistor and the fourth word line switch transistor, which is connected to a source of voltage. Terminal 1512 is the drain of the fourth word line switch transistor, and is connected to a word line. The four transistor are arranged in a line.

FIG. 15 shows four ST lines: STa, STb, STc and STd, which indicate where the blocks of memory cells will be positioned above the word line switch transistors. ST lines STa and STb mark the start and end of Block 0. ST lines STb and STb mark the start and end of Block 1. ST lines STa and STb mark the start and end of Block 2. Thus, the one row of columns of word line switch transistors depicted in FIG. 15 will be positioned underneath Block 0, Block 1 and Block 2. The width of Block 0 is indicated by the bracket labeled Block 0. The width of Block 1 is indicated by the bracket labeled Block 1. The width of Block 2 is indicated by the bracket labeled Block 2. The width of the three block combined is indicated by line 1530 (see also FIG. 4A).

As mentioned above, each column of FIG. 15 includes four transistors. The length of the first transistor of each column is indicated by line 1520. The length of the second transistor of each column is indicated by line 1522. The length of the third transistor of each column is indicated by line 1524. The length of the fourth transistor of each column is indicated by line 1526. The combined length of the four transistors (i.e. the length of the group of four transistors) in a column is indicated by line 1528. The combined length of the four transistors (i.e. the length of the group of four transistors) in a column is equal to the width of the three block combined, as line 1528 is the same length as line 1530.

In the example of FIG. 15, the word line switches are arranged in groups of four word line switches (e.g., each column is a group) such that each group of four word line switches is positioned in a line under three blocks of non-volatile memory cells (e.g., Block 0, Block 1 and Block 2) and each group has a length 1528 that is equal to the width 1530 of the three blocks of non-volatile memory cells. This technology is not limited to four word line switch transistors under three blocks, and can be used with other arrangements. For example, the word line switches can be arranged in groups of three word line such that each group of three word line switches is positioned in a line under two blocks of non-volatile memory cells and each group has a length that is equal to the width of the two blocks of non-volatile memory cells, or the word line switches can be arranged in groups of five word line such that each group of five word line switches is positioned in a line under four blocks of non-volatile memory cells and each group has a length that is equal to the width of the four blocks of non-volatile memory cells. Other numbers of word line switch transistors and blocks can also be used; for example, the word line switches can be arranged in groups of X word line switches such that each group of X word line switches is positioned in a line under Y blocks of non-volatile memory cells and has a length that is equal to the width of the Y blocks of non-volatile memory cells, where X>Y.

In one example embodiment, where the word line switches are arranged in groups of four word line switches (e.g., each column is a group) such that each group of four word line switches is positioned in a line under three blocks of non-volatile memory cells (e.g., Block 0, Block 1 and Block 2) and each group has a length 1528 that is equal to the width 1530 of the three blocks of non-volatile memory cells, a block includes 200 word lines and the three blocks are connected to 600 word line switch transistors arranged in 150 columns of 4 word line switches, with each column of 4 word line switch transistors having a length equal to the width of 3 blocks.

The word line switch transistors of the embodiment of FIG. 15 are smaller in length than the word line switch transistor of the prior art because they use more transistors to cover the same amount if blocks. Using smaller transistors enables the shrinking of the word line switch regions, which results in smaller CBL areas. This reduces the complexity of the routing of metal lines, and allows the control die and memory die to be smaller, both of which reduce costs.

NAND flash memory, such as the 3D embodiments presented above, is widely used for storage and data transfer in consumer devices, enterprise systems and industrial applications because of its nonvolatility, affordability, high storage density and access speeds. 3D NAND memory's capacity has enlarged significantly as the vertical layers (number of word lines) of the array have increased in number and become thinner. Because of this, word line related defects present a major challenge in device development. The common method to counter word line related defects is a combination of stress and screen. Engineers can use stress to make the defective points weaker and choose a proper screen to detect the defects and before the devices are passed on to the consumer. To determine word line leakage due to shorts, one or more of the word lines of a memory block or blocks are charged to a high stress voltage, such as a program voltage Vpgm or erase voltage, while other elements of the array are biased at a low voltage, such as Vss or 0V. The charged up word lines are then checked to see whether there is leakage current. Which word lines are biased at the stress voltage and what array elements are biased low depends on the test mode, where several test modes may be performed. The testing can be part of the test process performed on memory die before they are shipped out for customer use or, in other cases, such tests can also be formed once the memory die is in use. For example, leaky word lines may be detected during a built-in self-test (BIST). The specific type of test modes performed will depend on the specifics of the memory die, but for some examples in the 3D NAND memory example are tests for word line to memory hole leakage, word line to word line leakage, and word line to local interconnect leakage.

The determination of word lines related defects for a memory array is usually concerned with defects within the blocks of memory structure illustrated in FIGS. 4-4J and biases the array accordingly. For example, to check for word line to word line leakage, the even numbered word lines are biased high and the odd numbered word lines biased low, or vice versa. To check for word line to memory hole or word line to local interconnect leakage, all of the word lines of a block can be biased high, with either the memory holes or interconnects biased low. When a block is found to be defective, it can then be mapped out and not assigned data, and if a large number of blocks on a die are defective the die may be found defective and not shipped out. As the 3D NAND structures described above are quite complex, defects related to leaky word lines are often found between the different structural elements discussed with respect FIGS. 4-4J. However, leakage can also occur in the routing between the array structures and the peripheral circuitry described with respect to FIGS. 7-15. For example, as noted with respect to FIG. 15, although the use of smaller switches as described there can help to reduce routing complications, the routing is still complicated and smaller sizes can result in more routing lines being closer to each other. The following discussion considers defect determination for such layout problematic word line. As such leakage is routing away from the array structures of the individual memory blocks, such leakage, if undetected, can lead to defects expanding from a single grown bad block to a plane level failure. Although the discussion is presented in the context of 3D NAND memory as described above, it can more generally applied to other memory technologies, such as MRAM or PCM, that can also suffer from leakages from word lines or other control lines of the memory array and routing.

Considering the problem further, single or multiple WL shorts in NAND arrays usually only cause failures of a few of pages. During factory testing of devices, there are a number of built-in self-test (BIST) leak detection modes to screen out leaky blocks and mark them as factory bad blocks (FBB). Meanwhile, once in use by a customer, if any data loss happens due to word line shorts, the system will firstly try to recover user data, then retire the block as growing bad block (GBB). However, unlike word lines shorts inside of the array, word line shorts at the peripheral word line routing area can cause fatal plane level failure. Particularly if word lines shorts are close to global control gate voltage supply area, plane level failure could occur even if a shorted block has been marked as a bad block during factory testing or has been retired as a grown bad block by the system once in customer use. This is because the defect's location could still be stressed during user operation, since the global control gate supply lines carry a global signal before transfer gate of local word lines, and, as such, will get biased during good blocks' operation. This can be illustrated with respect to FIGS. 16 and 17.

Figure 16:
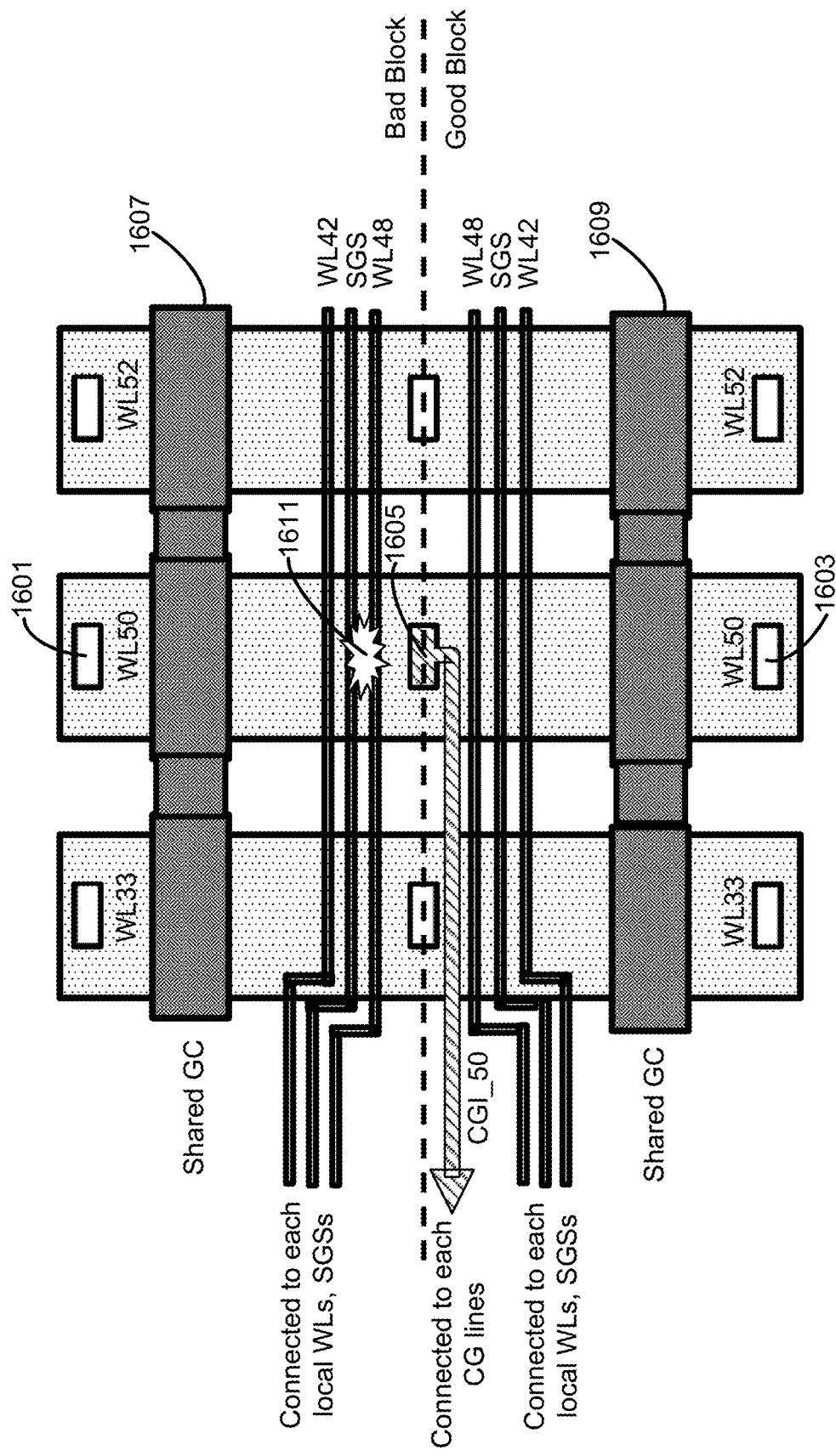
FIGS. 16 and 17 are schematic diagrams of user stress between a control gate supply line and a local word line metal layer in a top view and side view, respectively.
Figure 17:
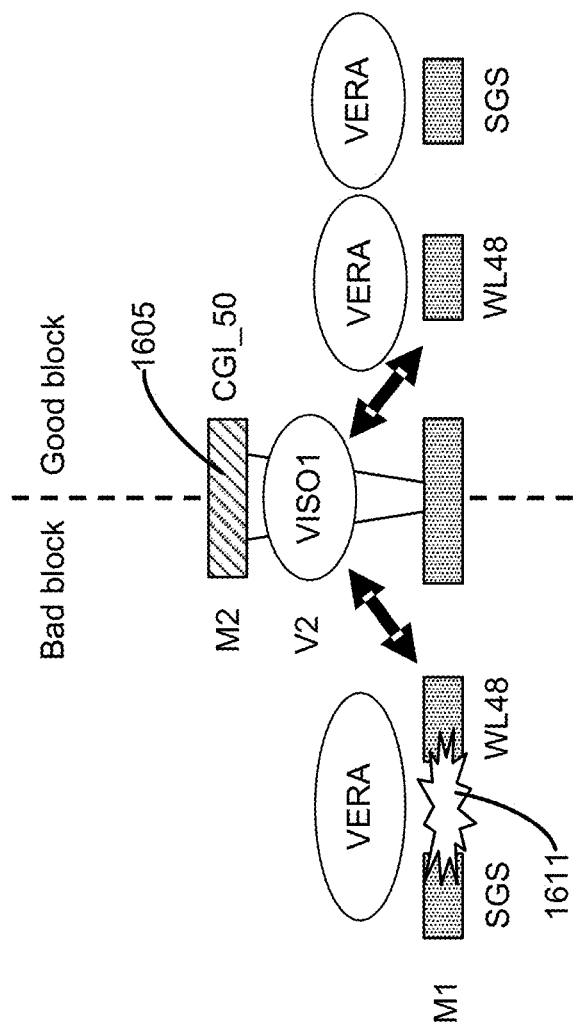

FIGS. 16 and 17 are schematic diagrams of user stress between a control gate supply line and a local word line metal layer in a top view and side view, respectively. More specifically, FIG. 16 shows three pairs of word line switches like those of FIG. 15 from above, where supply line from the drivers connects at the shared source at center and the local word line metal lines for a pair of block connecting to either side. For example, at center the line CGI_50 for word line 50 connects to the source 1605 and above and below are the drain connections for the local word line metal layers 1601 and 1603 for word line 50 of two different blocks. A shared control gate 1607 and 1609 for the shared control gates of the word line switches of the two blocks runs across the switch pairs, where the horizontal broken line shows the separation of the switch pairs for the two blocks, where the switches for word lines 33 and 52 of the two blocks are also shown. Running over the top of the switches are shown some of the local metal lines from other switches, with those of the source side select gates SGS and word lines 42 and 48 are shown. (Which lines are adjacent to which other lines and the other details will depend on the specifics of the layout, with the shown embodiment is just a particular example.) FIG. 17 is a side view of the lines running parallel over the switches in the top view of FIG. 16. At center, in the M2 metal layer is the CGI_50 line 1605 that then connects by a via V2 to the source terminal connection in the M1 metal layer below. (FIG. 17 is oriented upside down relative to FIG. 11 and similar figures above.) To either side is the M1 line for word lines 48 of the two blocks sharing the word line switch and, outside of the WL48 M1 lines, the M1 lines for source side select gates SGS of the two blocks. Also shown in FIGS. 16 and 17 is a defect 1611 in the M1 layer. In this particular example, this short is between the M1 line WL 48 for word line 48 and the M1 line for the select gates SGS of the block labelled as a bad block because of this short. The other block lacks such a defect and is labelled as a good block. If the short were within the array structure, it could typically be isolated to the one bad block. However, when the short is in the periphery as here, the situation can be more complicated.

In the scenario of FIGS. 16 and 17 the local word line in the M1 layer and the CGI line in M2 layer is stressed during user erase for other good blocks. In this case, local word lines of all unselected blocks are coupled to similar voltage (~VERA) as memory hole and source line, so data will not be erased for unselected blocks. However, the common CG line will get low bias of VISO (a very low voltage, e.g. ~0.5V) so as to pass the low bias to selected block for cell erase. As shown in FIG. 17 CGI_50 1605 is biased at VISO, these two blocks are unselected blocks for user erase, so local M1 line for the select gate line SGS and WL48 of both bad and good blocks are coupled to the erase voltage VERA (a very high voltage ~18V). Therefore, as time goes on, the short could grow towards CGI side, and finally lead to global CGI short, in which all blocks sharing same CGI line, which could a significant part of a plane, would become grown bad blocks that could result in plane level failure.

For example, if the local SGS M1 line was shorted to the local WL48 M1 line in the bad block, it could then short the CGI_50 by strong stress during repeated erase cycles. If the initial defect was caught during die sort, the defective block would have been marked as a factory bad block. As illustrated in FIG. 17, the WL48-CGI_50 region would be repeatedly stressed perhaps hundreds of thousands of times once the device is in use when other good blocks were erased, eventually causing defect growth towards the CGI side and triggering a global short. Even if it has not progressed to a full global short, such defects can still result in uncorrectable data loss before eventually causing a global CGI short if a user keeps using the device to end of life. As device sizes continue to shrink, such metal line defects could become more common defects for memory devices. Consequently, it is important to be able to identify such defects.

Typical leak detection test modes do not specify word lines to test at the individual word line level, but rather measure leakage for all the word lines of a block (such as by setting all of the block's word lines high and other array components (such as memory holes or local interconnects) low, or biasing word lines high in groups (such as for even/odd word lines for word line to word line leakage or for groups of word lines corresponding to different drivers). This has the result that a block is judged to be leaky based on measuring all of the word lines or grouped word lines, but does not provide a chance to determine the individual word lines that leak. Particularly for the M1 type of defect discussed with respect to FIGS. 16 and 17, being able to isolate specific word lines with possible such routing defects would allow for the more proper die level rejection, rather the block level rejections that are determined in the typical leak detection nodes. Combining different test modes can sometimes help narrow down the determination of which word lines may be defective, but only to some extent. Moreover, CGI groups and word line metal routing can be significantly different from generation to generation of a device, so that any leakage detection combinations proved effective in one generation could completely malfunction in a new one. Therefore, a new problematic word line detection mode is necessary, which should be able to detect desired word line shorts around global CGI and that is adaptive to different layouts.

To address this problem, a problematic word line-periphery leakage mode to determine defects, like the type of M1 word line described with respect to FIGS. 16 and 17, that can expand from a field grown bad block to a plane level failure. This mode will be directed at specific, layout dependent local control line pairs running adjacent to global control gate supply lines, where the specific word lines or select lines will be particular the design's layout. For example, in the case of FIGS. 16 and 17, word line 48 and the source side select gate would be chosen.

Figure 18:
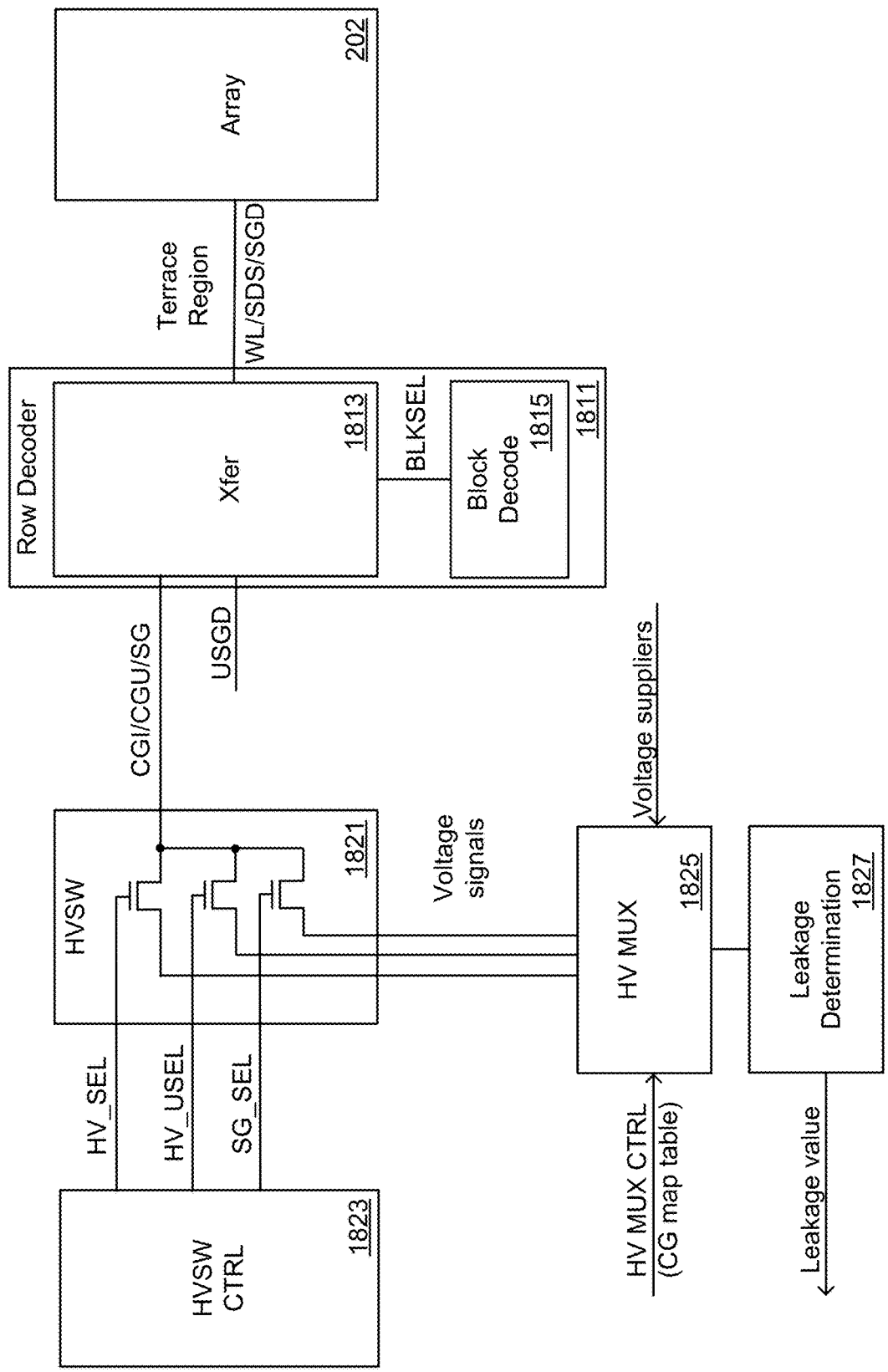
FIG. 18 is a simplified diagram showing how different voltages are transported from peripheral voltage suppliers to specific word lines and select gates.

FIG. 18 is a simplified diagram showing how different voltages are transported from peripheral voltage suppliers to specific word lines and select gates. The high voltage multiplex circuit HV MUX 1825 is a complex multiplexer to select corresponding the voltage sources from voltages suppliers for the control gate drivers in different operating modes. The voltage suppliers include charge pumps and other supply sources of the power control block 264 that generate and provide the higher voltage levels that are provided to the word lines and select gate though high voltage switches. Examples include programming voltages, verify and read voltages, program and read voltages (Vpass, Vread) applied to unselected word lines, and select gate voltage levels, for example. The voltage signals selected by the high voltage multiplex circuit HV MUX 1825 are from other elements of the system control logic 260, such as based on a control gate mapping table. The selected voltage signals are then supplied from the high voltage multiplex circuit HV MUX 1825 to the high voltage switches HVSW 1821. FIG. 18 also includes a leakage determination block 1827 that will be discussed below following the discussion of FIG. 19.

The high voltage switches HVSW 1821 are represented by one switch each for the selected word lines revieing one of the high voltage signals, unselected word lines receiving one of the high volage signals, and the select gates receiving one of the high voltage signals. The high voltage switch control block HVSW CTRL 1823, which can be part of the system control logic 260, provides the corresponding set of respective control signals HV_SEL, HV_USEL, and SG_SEL. The output signals are then provided to the corresponding respective global supply lines CGI, CGU, and SG, which are in the M2 layer for the example described above with respect to FIGS. 16 and 17. These voltages are then received at the row decoder circuitry 1811, which also receives the lower voltage control gate signal USGD, which do not use high voltage switches (e.g., Vss), from the corresponding gate drivers. The row decoder circuitry 1811 is shown to include both the transfer circuits Xfer 1813 and the block decode circuitry 1815, which provide the block select signals BLKSEL to the transfer circuits Xfer 1813. As described with respect to the embodiment of FIGS. 15-17, the transfer switches of Xfer 1813 receive global supply lines CGI, CGU, and SG that are in the M2 layer and connect them to the local word lines, drain sided select gate control lines, and source side select gate control through the terrace region to the array 202.

Figure 19:
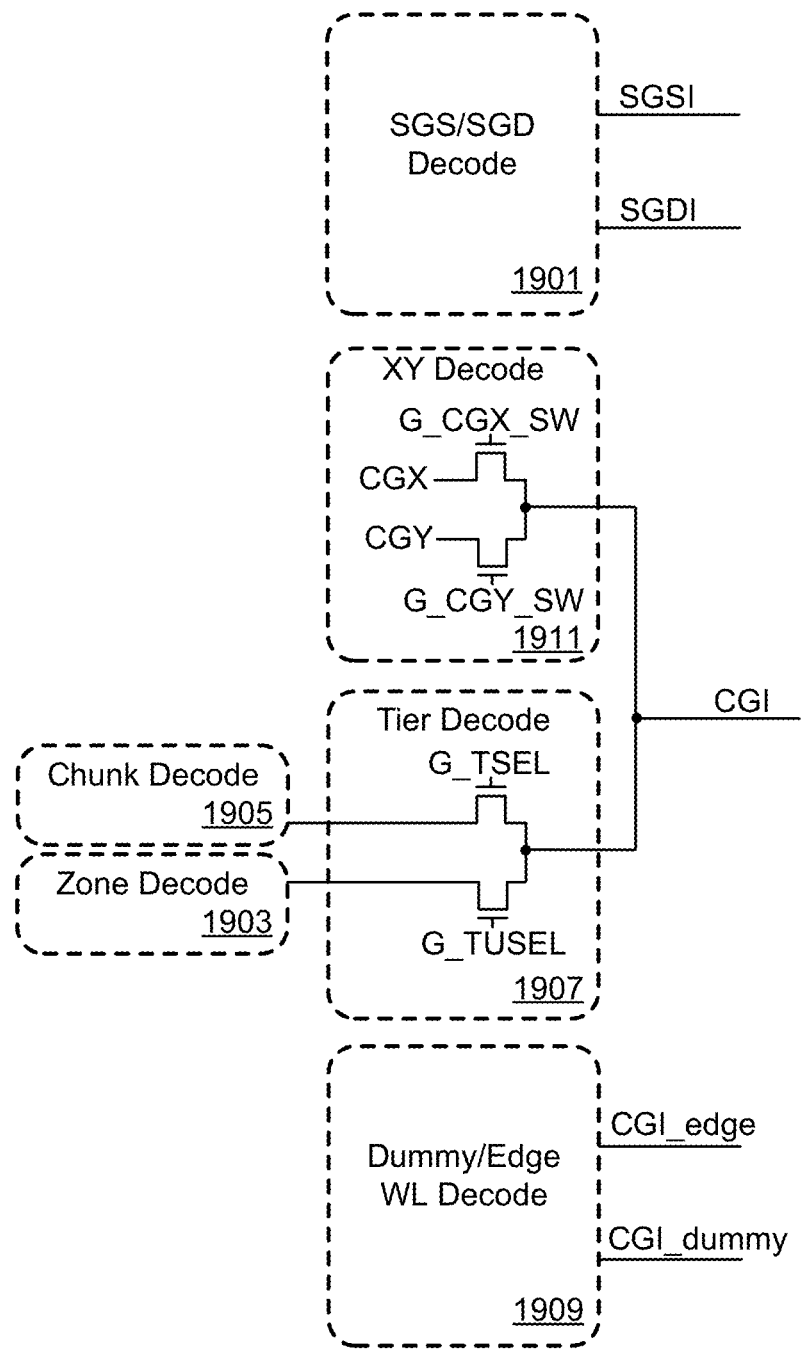
FIG. 19 is a schematic of some elements of the high voltage switches of FIG. 18 for an embodiment that includes a layout adaptive problematic word line detection mode.

FIG. 19 is a schematic of some elements of the high voltage switches HVSW 1821 for an embodiment that includes a layout adaptive problematic word line detection mode. Aside from the XY decode 1911, the high voltage switches of the different decoders are representative embodiment for some of the elements of HVSW 1821 of FIG. 21. These include the SGS/SGD decode circuitry 1901 that provide the global supply line voltages SGSI and SGDI for the source and drain side select gates, respectively, in the M2 layer to the row decoder 1811. (Although SGSI and SGDI are shown as a single line, these and the other output lines of FIG. 19 will be multiple lines; for example, the CGI lines will include a line each non-edge, non-dummy word line.) In the embodiment of FIG. 19, dummy word lines and edge word lines (i.e., those on the source and drain ends of the NAND strings) are decoded separately from the other word lines in Dummy/Edge WL decode block 1909 to respectively provide CGI_dummy and CGI_edge. To generate the global supply signals CGI for the word lines, several different levels of decoding are commonly used. For example, different levels of decoding may be based on which word lines are supplied by which charge pumps or based on structures of the memory blocks. For example, in a vertical 3D NAND structure such as described with respect to FIGS. 4-4J, the word lines can be split into upper and a lower tiers of word lines to allow for upper sub-block and lower sub-block level operations. In FIG. 19, these different levels of word line decoding are schematically represented by a chunk level decoder 1905 and a zone level decoder 1903 that provide signals to a tier level decoder 1907 that can select between these signals based on a selected tier control signal G_TSEL and an unselected tier control signal G_TUSEL to provide the output voltages the CGI supply lines. In typical word line leakage detection modes that focus on shots within the block structure, voltages are passed to the select gates and the data and dummy word lines through the different drivers based on this decoding. However, this does not provide the needed flexibility to independently bias each word line for the detection of the layout related shorts as discussed above with respect to FIGS. 16 and 17.

To address this, an XY decode block 1911 is added to the HVSW block 1821 to enable independent bias on individual word lines of the pair tested for detection of the layout related shorts in the global word line supply lines. CGX and CGY are CG drivers to provide different biases to word lines requested to be tested. In this mode, all HVSW gate signals for zone, chunk and tier decode are OFF, with only XY decode, SG decode, and edge/dummy WL decode being used. In XY decode, the corresponding control signal G_CGX_SW or G_CGY_SW for targeted word lines will be ON to pass high and low bias levels, respectively. In this embodiment XY decode 1911 will be added for (non-edge, non-dummy) word lines targeted for this test mode, since select gates and edge/dummy word lines have specific CG drivers already. As discussed with respect to FIG. 22, the targeted word lines are determined after layout is fixed based on the M1 layer lines adjacent to a CGI line. For example, in the example this would include SGS-WL48. To take one particular layout embodiment, other pairs could be SGS-WL54, WL46-WL44, and WL43-WL41.

Therefore, in the layout problematic word line leak detection mode, only possibly problematic word line-word line or word line-select gate line pairs will get a high and low bias from XY decode 1911 or SG decode 1901 or edge/dummy WL decode 1909, with all other non-selected word lines floating. Taking the SGS-WL48 short example from FIGS. 16 and 17, to generate a bias between WL48 and SGS, a program voltage VPGM and VSS (or vice versa) are applied to CGX and an SGS_SEL driver. In XY decode G_CGX_SW is turned ON, as is the switch in SGS/SGD decode 1901 to pass G_SG_CSEL to pass the voltage to SGSI. Except WL48 and SGS, other select gate and data/dummy word lines are floating, as their corresponding HVSW gates are turned off. Therefore, presence of an SGS-WL48 short can be accurately determined without being hidden by other possible word line shorts.

Returning to FIG. 18, this includes leakage determination circuitry 1827 for the control circuitry, where this can be part of the system control logic 260. When the adjacent pair of local control supply lines, such as SGS and WL48, are biased with the stressing voltage differential, such as Vpgm and Vss, the control line at the high voltage level can be monitored for leakage. A number of differing embodiments are possible, including both voltage based and current based detection. For example, after charging up the control line receiving high voltage, the voltage can be trapped on the control line and then monitored, such as checking after a test interval to see whether it has discharged enough current to drop the voltage level below a reference level. In a current based approach, the amount current being drawn to maintain the control line at the high bias voltage can be compared to reference values, either directly or by use of a current mirror. Other approaches include monitoring the operation of the charge pump supplying the high voltage level.

Figure 20:
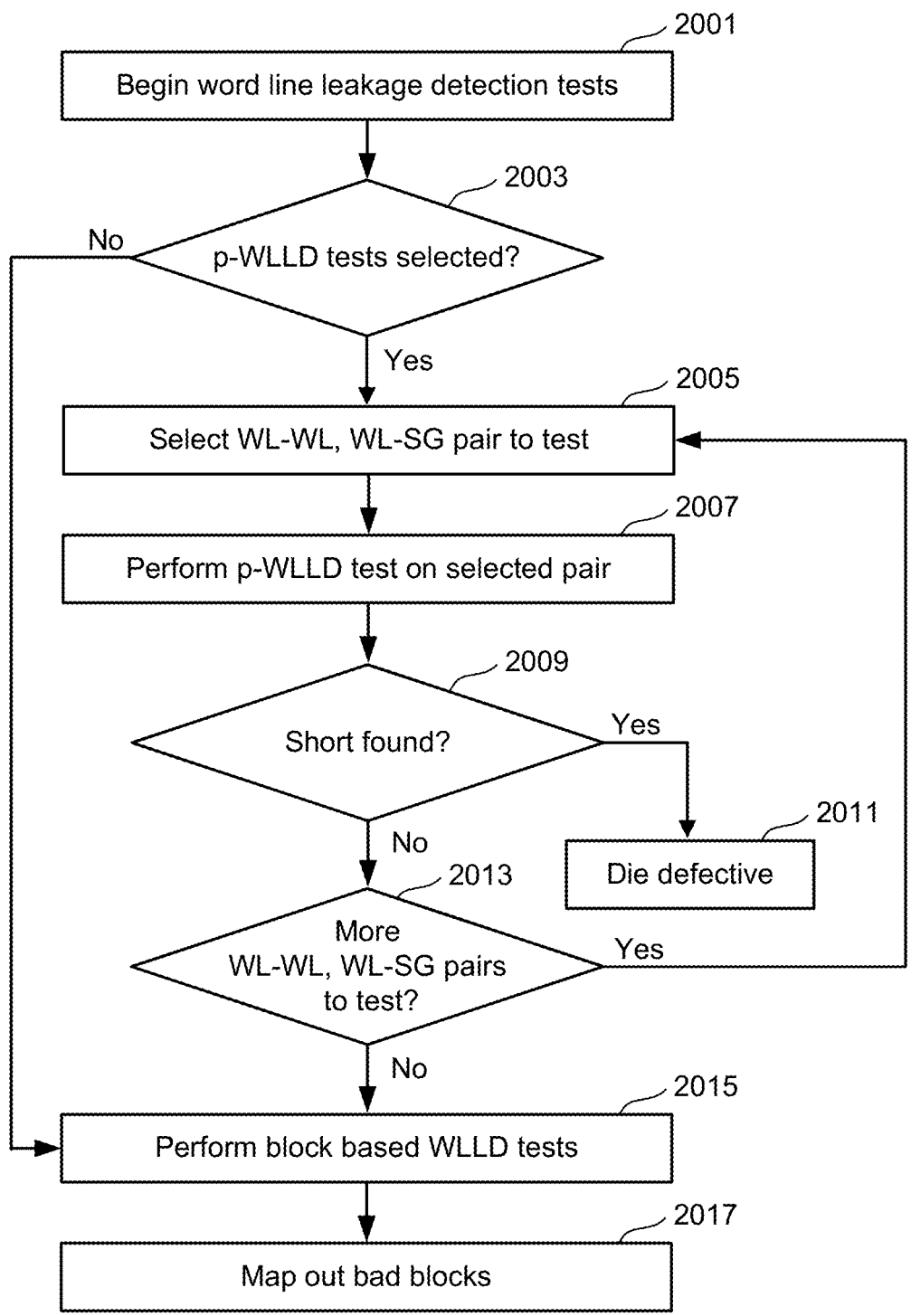
FIG. 20 is a flowchart of an embodiment for word line leakage detection that can include a layout problematic word line leak detection mode.

FIG. 20 is a flowchart of an embodiment for word line leakage detection that can include a layout problematic word line leak detection mode. The word line detection tests begin at step 2001, where these can be part of the tests performed at the die sort process before the dies are sent out to customers or, alternately or additionally, performed once the device is in use based on a command from the memory controller 120, for example. Step 2003 determines whether the leakage detection tests will include a layout problematic word line leak detection (p-WLLD) mode: if so, the flow goes to step 2005; and if not, the flow goes to step 2015. At step 2005 the system control logic 260 selects a first pair of control lines from the word lines and select lines to test for leakage. The layout problematic word line leak detection mode, including the high voltage transfer switch specifications, then follows at step 2007.

Figure 21:
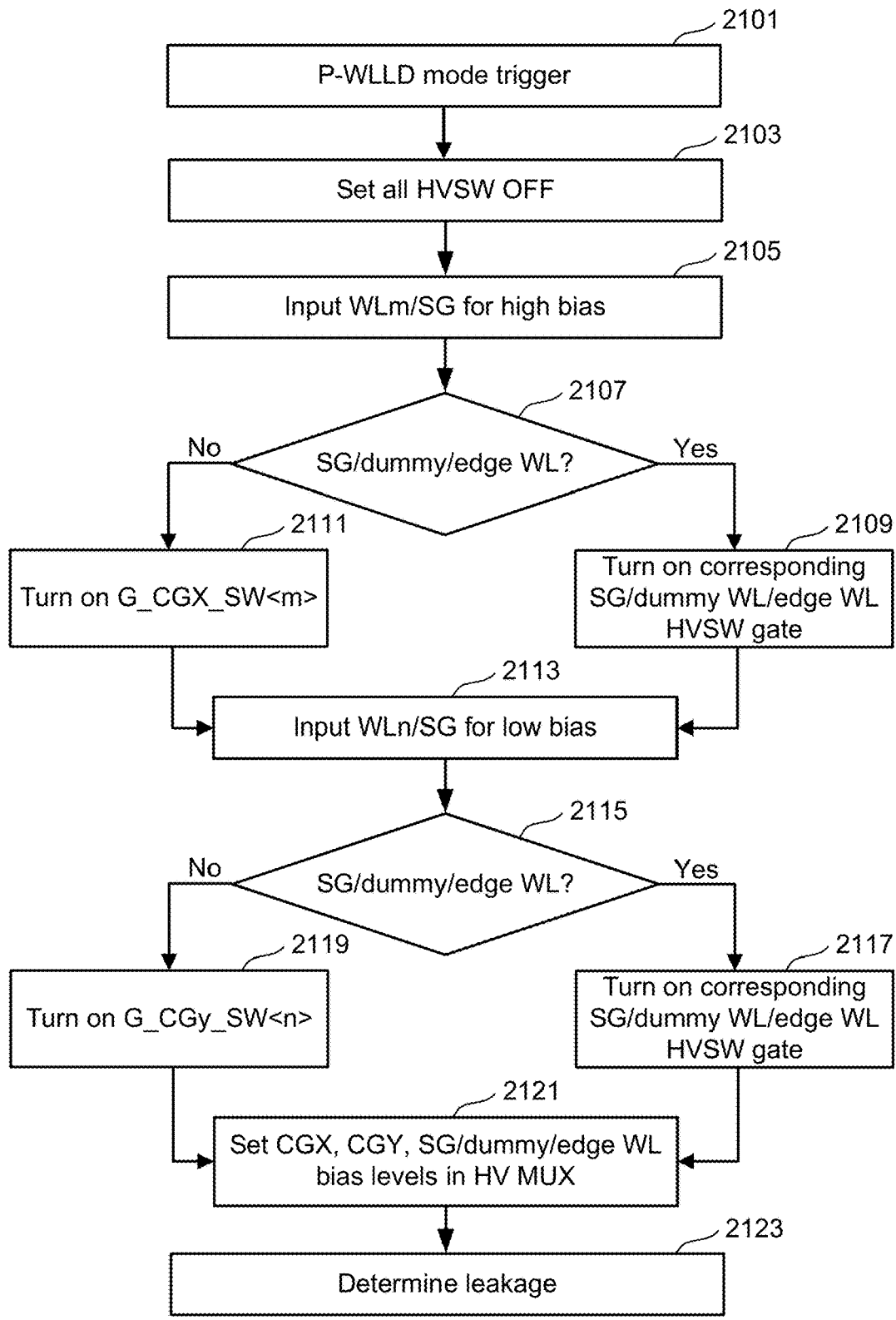
FIG. 21 is a flowchart for an embodiment of the problematic word line leak detection step of FIG. 20.

FIG. 21 is a flowchart for an embodiment of the problematic word line leak detection in step 2007 of FIG. 20, beginning at step 2101 when the system control logic 260 triggers the mode. As preparation for the test, at step 2103 the HVSW CTRL circuitry 1823 turns off all of the high voltage switches of the HVSW circuitry 1821. A first of the word line WLm or other control line of the first word line-word line or word lines-select gate pair is input by the system control logic 260 at step 2105, followed by determination of whether it is a select gate line, dummy word line, or edge word line at step 2107. If so, the HVSW CTRL circuitry 1823 turns on the corresponding high voltage switch in the SGS/SGD decode block 1901 or dummy/edge WL decode block 1909 at step 2109. If the first control line of the pair is a word line WLm, the corresponding switch in the XY decode block 1911 can be turned on the HVSW CTRL circuitry 1823 at step 2111. As noted above, it is only the relatively few word lines that will be checked for this mode that will have switches in the XY decode block 1911. Steps 2113, 2115, 2117, and 2119 repeat steps 2105, 2107, 2109, and 2111, but for the second word line WLn or select gate of the test pair. Although the process for the two control lines of the test pair is shown to be sequential and in particular order in FIG. 21, they can be performed in either order or concurrently. At step 2121 the HV MUX 1825 can then provide the needed bias levels for CGX, CGY, select gate, dummy word line, and edge word lines the HVSW circuitry 1821. Once the biased conditions are established, the leakage determination circuitry 1827 can determine whether there is leakage at step 2123. Various embodiments can be determined according to various embodiments, such as charging up the control line to the high voltage (e.g., Vpgm), trapping this voltage and monitoring the rate at which it discharges; or such as by monitoring the amount of current drawn when maintain the high voltage bias level.

Returning to FIG. 20, based on step 2123 at step 2009 the determination is made on whether a short has been found. Since this defect will be at the level of a plane or a multiple block portion of a plane, the die would typically be declared defective at step 2011, the testing discontinued, and the part not shipped. Alternatively, if there are other non-defective planes on the die, or portions of the defective plane not affected by the short, the die could be set aside for applications that have lower requirements. If there is not a short found, at step 2013 the system control logic 260 determines if there are more control line pairs to check at step 2013, looping back to step 2005 if so. (The embodiment of FIG. 20 has the pairs checked sequentially, but in other embodiments these can be performed concurrently.) Once all of the pairs are checked for the layout problematic word line leak detection mode, the block based word line leak detection tests (e.g., word line to word line, word line to memory hole, and so on) are performed at step 2015, with defective blocks mapped out at step 2017 or, if the number exceeds an acceptable limit, the die can be found defective. Although the embodiment of FIG. 20 places the block level leakage tests after the layout problematic word line leak detection, in other embodiments the layout problematic word line leak detection can be performed after or interspersed with the block level tests.

The incremental increase in die size for the circuitry to implement the layout problematic word line leak detection mode is relatively negligible, requiring on the order of 10-20 HVSW transistors for the CGX/CGY drivers and 10-20 level shifters for the G_CGX_SW G_CGY_SW per plane. This is a small number relative to the other decoding switches. This requirement can be further reduced if all of the control line pairs are checked concurrently.

Although discussed for the example of a 3D NAND memory device and a particular set of defects in the routing of metal lines, it can be applied to other types routing related defects in supply lines for the memory cells and to other memory technologies. Even for the same type of memory device and same defect, considering the variance of metal routing for different generations, the problematic word line leak detection mode is also layout adaptive. That is, CGX/CGY transistors can be flexibly modified to different word lines depending on product layouts. For example, in the embodiments described above the M1 pairs of word/select line pairs running close to CGI contacts are risky word lines, so any dies with those word line pairs shorted would be risky dies. Consequently, for a given device, after layout is fixed, the risky word lines next to global CGIs can be easily determined. Looping all targeted word line pairs in this test mode can then greatly suppress the risk of global CGI shorts.

Figure 22:
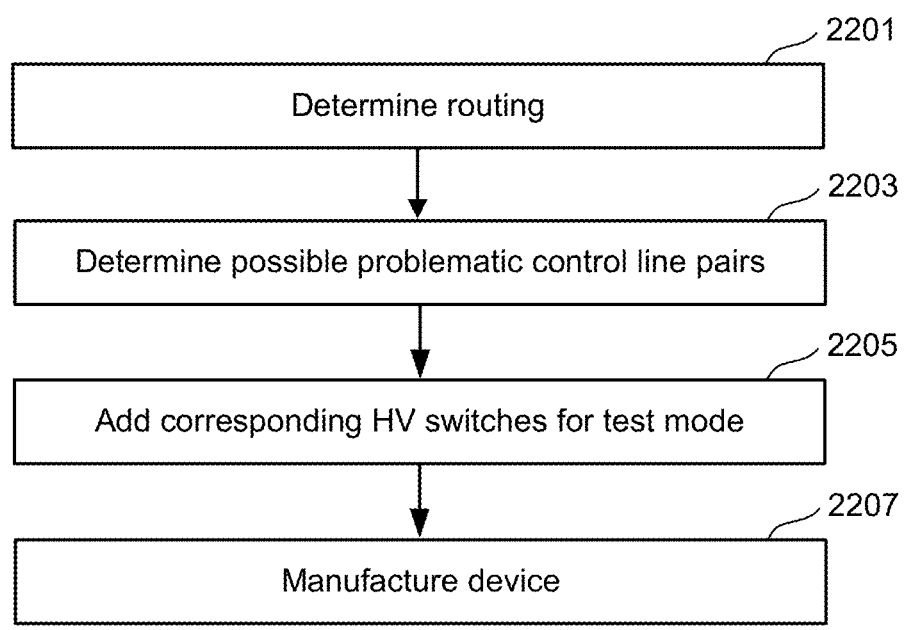
FIG. 22 is a flowchart illustrating the layout adaptability of the problematic word line leak detection mode.

FIG. 22 is a flowchart illustrating the layout adaptability of the embodiments presented here. At step 2201, as part of the design process the routing of the control lines' layers are determined. Once the routing is known, the possible problematic control line pairs are determined at step 2203. Corresponding high voltage switches and other needed circuitry for the test mode are then add to the design at step 2205. Once the design is set, the device can be manufactured at step 2207.

One embodiment includes a non-volatile memory system including a control circuit configured to connect to an array comprising a plurality of blocks, each of the blocks comprising a plurality of non-volatile memory cells and a plurality control lines for accessing the memory cells, the control lines including word lines along which the memory cells are connected. The control circuit comprises: a first global supply line configured to provide bias voltages to a corresponding a first control line of each of the blocks; a plurality of local supply lines for each the blocks, each local supply line configured to connect to a corresponding one of the corresponding block's control lines, including a first local supply line configured to connect to the first control line of the corresponding block; and a plurality of transfer switches, comprising a switch corresponding to each of the local supply lines for each of the blocks, including a first switch for each of the blocks connecting the first global supply line to the corresponding first local supply line, where a plurality of the local supply lines for each of the blocks are routed over the transfer switches and include a first pair of local supply lines routed adjacent to one another and adjacent to the first global supply line. The control circuit is configured to determine a short between the first pair of local supply lines of the one or more of the blocks, where, to determine the short between the first pair of local supply lines of the one or more of the blocks, the control circuit is configured to concurrently: bias a first of each of the first pairs of local supply lines at a high voltage; bias a second of each of the first pairs of local supply lines at a low voltage; and float the local supply lines other than those of the first pairs.

One embodiment includes a method comprising: for each of a plurality of blocks of a non-volatile memory array, biasing a pair of local supply lines for a corresponding pair of control lines to have a voltage difference therebetween, the pair of control lines being two of a plurality of control lines for the correspond block, the control lines including word lines for the corresponding block, each of the pair of control lines routed adjacent to each other and adjacent to a global supply line for the control lines of the plurality of blocks; while biasing the pair of local supply lines for the corresponding pair of control lines of each of the blocks to have the voltage difference therebetween, determining whether there is current leakage between one or more of the pairs of local supply lines; and determining whether the memory array is defective based on determining that there current leakage between one or more of the pairs of local supply lines.

One embodiment includes a non-volatile memory system comprising: a non-volatile memory array comprising a plurality of blocks; biasing circuitry; and one or more control circuits connected to the array and the biasing circuitry. Each of the blocks comprises: a plurality of memory cells; and a plurality of control lines for accessing the memory cells, including word lines along which the memory cells are connected. The biasing circuitry comprising: a plurality of global supply lines configured to provide bias voltages to a corresponding one of the control lines for each of the blocks; a plurality of local supply lines for each the blocks, each local supply line configured to connect to a corresponding one of the corresponding block's control lines; and a plurality of transfer switches, including a switch corresponding to each of the local supply lines for each of the blocks and configured to connect the local supply lines for each of the blocks to the global supply lines corresponding to the same control line, where a plurality of the local supply lines for each of the blocks are routed over the transfer switches and include a first pair of local supply lines routed adjacent to one another and adjacent to one of the global supply lines.

The one or more control circuits are configured to: for each of a plurality of blocks, biasing the first pair of local supply lines for a corresponding pair of control lines to have a voltage difference therebetween; while biasing the pair of local supply lines for the corresponding pair of control lines of each of the blocks to have the voltage difference therebetween, determining whether there is current leakage between one or more of the pairs of local supply lines; and determining whether the memory array is defective based on determining that there current leakage between one or more of the pairs of local supply lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory system, comprising:
   a control circuit configured to connect to an array comprising a plurality of blocks, each block of the plurality of blocks comprising a plurality of non-volatile memory cells and a plurality of control lines for accessing the plurality of non-volatile memory cells, the plurality of control lines including word lines along which the plurality of non-volatile memory cells are connected, the control circuit including decoding circuitry comprising:
   a first global supply line configured to provide bias voltages to a corresponding first control line of the plurality control of each block of the plurality of blocks;
   a plurality of local supply lines for each block of the plurality of blocks;
   a plurality of local supply line transfer switches configured to connect each of the local supply lines to a corresponding one of the corresponding block's plurality of control lines, including connecting a first local supply line to the first control line of the corresponding block of the plurality of blocks; and
   a plurality of global supply line transfer switches, comprising a global supply line transfer switch corresponding to each of the plurality of local supply lines for each of the plurality of blocks, including a first global supply line transfer switch for each block of the plurality of blocks connecting the first global supply line to the corresponding first local supply line, where multiple ones of the plurality of local supply lines for each block of the plurality of blocks are routed over the global supply line transfer switches of each block of the plurality of blocks and include a first pair of the local supply lines routed adjacent to one another and adjacent to the first global supply line,
   the control circuit configured to determine a short between the first pair of the local supply lines of one or more blocks of the plurality of blocks, where, to determine the short between the first pair of the local supply lines of the one or more of the plurality of blocks, the control circuit is configured to, while the plurality of local supply lines are disconnected to the corresponding ones of the corresponding block's plurality of control lines, concurrently:
     bias, for each of the plurality of blocks, a first of the first pair of the local supply lines at a high voltage;
     bias, for each of the plurality of blocks, a second of the first pair of the local supply lines at a low voltage; and
     float the local supply lines other than those of the first pairs of the local supply lines.

2. The non-volatile memory system of claim 1, wherein the control circuit is formed on a control die, the non-volatile memory system further comprising:
   a memory die including the array, the memory die separate from and bonded to the control die.

3. The non-volatile memory system of claim 1, wherein both local supply lines of the first pair the local supply lines correspond to word lines of the corresponding block.

4. The non-volatile memory system of claim 1, wherein the array comprising a plurality of blocks is a NAND array, the plurality of control lines including select gate control lines, and one of the local supply lines of the first pair corresponds to a select gate control line.

5. The non-volatile memory system of claim 1, wherein the array comprising a plurality of blocks is a NAND array, the plurality of word lines including dummy word lines, and one of the local supply lines of the first pair corresponds to a dummy word line.

6. The non-volatile memory system of claim 5, further comprising:
   the NAND array, the NAND array having a three dimensional architecture in which the word lines run horizontally relative to a substrate.

7. The non-volatile memory system of claim 1, wherein the control circuit is on a die, the first global supply line is routed in a first metal layer and the first pairs of local supply lines are routed in a second metal layer.

8. The non-volatile memory system of claim 1, wherein the control circuit further comprises:
   a plurality of high voltage switches configured to provide the high voltage to the first of each of the first pairs of local supply lines, provide the low voltage to the second of of each of the first pairs of local supply lines, and disconnect the local supply lines other than those of the first pairs of local supply lines while determining the short between the first pair of local supply lines of the one or more of the blocks.

9. The non-volatile memory system of claim 1, wherein, to determine the short between the first pair of local supply lines of the one or more of the blocks, the control circuit is further configured to:
while concurrently biasing the first of each of the first pairs of local supply lines at the high voltage and biasing the second of each of the first pairs of local supply lines at the low voltage, determine an amount of current leakage from the first of each of the first pairs of local supply lines.

10. The non-volatile memory system of claim 9, wherein, to determine the short between the first pair of local supply lines of the one or more of the blocks, the control circuit is further configured to:
determine whether the control circuit is defective based on the amount of the leakage current exceeding a limit value.

11. The non-volatile memory system of claim 1, wherein the high voltage is a programming voltage and the low voltage is ground.

12. A method, comprising:
for decoding circuitry for an array having a plurality of blocks of non-volatile memory cells having a plurality of control lines, including word lines, the decoding circuitry including a plurality of global supply lines configured to provide bias voltages to a corresponding one of the plurality of control lines for block of the plurality of blocks, a plurality of local supply lines for each block of the plurality of blocks, a plurality of local supply line transfer switches configured to connect each of the local supply lines to a corresponding one of the corresponding block's plurality of control lines, and a plurality of global supply line transfer switches, including a global supply line transfer switch corresponding to each of the plurality of local supply lines for each of the plurality of blocks and configured to connect the local supply lines for each of the blocks to the global supply lines corresponding to the same control line, for each of a plurality of the blocks of a non-volatile memory array, with the plurality of local supply lines disconnected to the plurality of control lines, biasing a pair of the local supply lines for a corresponding pair of the control lines to have a voltage difference therebetween, the pair of control lines being two of the plurality of control lines for the corresponding block, each of the pair of local supply lines routed adjacent to each other and adjacent to one of the global supply lines for the control lines of the plurality of blocks;
while biasing the pair of local supply lines for the corresponding pair of control lines of each of the blocks to have the voltage difference therebetween, determining whether there is current leakage between one or more of the pairs of local supply lines; and
determining whether the memory array is defective based on determining that there is current leakage between one or more of the pairs of local supply lines.

13. The method of claim 12, further comprising:
while determining whether there is current leakage between one or more of the pairs of local supply lines, setting local supply lines other than the pairs of local supply lines to float.

14. The method of claim 12, wherein both of the pair of control lines for each of the blocks are word lines.

15. The method of claim 12, wherein the non-volatile memory array has a NAND architecture and wherein one of the pair of control lines for each of the blocks is a select gate control line.

16. A non-volatile memory system, comprising:
a non-volatile memory array comprising a plurality of blocks, each of the blocks comprising:
a plurality of memory cells; and
a plurality of control lines for accessing the memory cells, including word lines along which the memory cells are connected;
decoding circuitry configured to selectively bias the plurality of control lines, comprising:
a plurality of global supply lines configured to provide bias voltages to a corresponding one of the plurality of control lines for block of the plurality of blocks;
a plurality of local supply lines for each block of the plurality of blocks;
a plurality of local supply line transfer switches configured to connect each of the local supply lines to a corresponding one of the corresponding block's plurality of control lines; and
a plurality of global supply line transfer switches, including a global supply line transfer switch corresponding to each of the plurality of local supply lines for each of the plurality of blocks and configured to connect the local supply lines for each of the blocks to the global supply lines corresponding to the same control line, where a plurality of the local supply lines for each of the blocks are routed over the global supply line transfer switches and include a first pair of local supply lines routed adjacent to one another and adjacent to one of the global supply lines; and
one or more control circuits connected to the array and the decoding circuitry, the one or more control circuits configured to:
for each of a plurality of the blocks, with the plurality of local supply lines disconnected to the plurality of control lines, bias the first pair of local supply lines for a corresponding pair of the control lines of the block to have a voltage difference therebetween;
while biasing the pair of local supply lines for the corresponding pair of control lines of each of the blocks to have the voltage difference therebetween, determine whether there is current leakage between one or more of the pairs of local supply lines; and
determine whether the memory array is defective based on determining that there is current leakage between one or more of the pairs of local supply lines.

17. The non-volatile memory system of claim 16, the biasing circuitry further comprising:
a plurality of high voltage switches configured to provide a high voltage to a first of each of the first pairs of local supply lines, provide a low voltage to a second of the of each of the first pairs of local supply lines, and disconnect the local supply lines other than those of the first pairs of local supply lines while determining whether there is current leakage between the one or more of the pairs of local supply lines.

18. The non-volatile memory system of claim 16, wherein both local supply lines of the first pairs correspond to word lines of the corresponding block.

19. The non-volatile memory system of claim 16, wherein the non-volatile memory array is a NAND memory array, the control lines include select gate control lines, and one of the local supply lines of the first pairs corresponds to a select gate control line.

20. The non-volatile memory system of claim 16, wherein the non-volatile memory array is a NAND memory array and one of the local supply lines of the first pairs corresponds to a dummy word line.

* * * * *